United States Patent [19]
Ohno et al.

[11] Patent Number: 5,209,917
[45] Date of Patent: May 11, 1993

[54] LITHIUM NIOBATE SINGLE CRYSTAL THIN FILM AND PRODUCTION METHOD THEREOF

[75] Inventors: Satoshi Ohno; Ryo Enomoto; Masaya Yamada, all of Ibigawa, Japan

[73] Assignee: Ibiden Co., Ltd., Ogaki, Japan

[21] Appl. No.: 700,169

[22] PCT Filed: Sep. 20, 1990

[86] PCT No.: PCT/JP90/01207

§ 371 Date: May 17, 1991

§ 102(e) Date: May 17, 1991

[87] PCT Pub. No.: WO91/04360

PCT Pub. Date: Apr. 4, 1991

[30] Foreign Application Priority Data

| Sep. 20, 1989 | [JP] | Japan | 1-242285 |
| Dec. 29, 1989 | [JP] | Japan | 1-342355 |
| Dec. 29, 1989 | [JP] | Japan | 1-342356 |
| Dec. 29, 1989 | [JP] | Japan | 1-342357 |
| Apr. 26, 1990 | [JP] | Japan | 2-112148 |

[51] Int. Cl.$^5$ .................. C30B 29/30; C30B 19/02
[52] U.S. Cl. ................................. 423/592; 423/641; 423/593; 156/621; 156/624; 156/DIG. 71; 156/DIG. 87
[58] Field of Search ............ 156/621, 624, DIG. 71, 156/DIG. 87; 423/592, 593, 641

[56] References Cited

U.S. PATENT DOCUMENTS

| 3,998,687 | 12/1976 | Ballman et al. | 156/619 |
| 4,001,076 | 1/1977 | Robinson et al. | 156/624 |
| 4,073,675 | 2/1978 | Ballan et al. | 156/600 |
| 4,953,931 | 9/1990 | Miyazaki et al. | 385/122 |

FOREIGN PATENT DOCUMENTS

51-9720 3/1976 Japan.
63-195198 8/1988 Japan ................. 156/624

OTHER PUBLICATIONS

Ballman et al (III), "The Growth of LiNbO$_3$ Thin Films by Liquid Phase Epitaxial Techniques", Journal of Crystal Growth, 29 (1975) pp. 289–295.

Tien et al, "Light Beam Scanning and Deflection In Epitaxial LiNb$_3$O$_3$ Electro-Optic Waveguides", Applied Physics Letters, vol. 25, No. 10, Nov. 15, 1974, pp. 563–565.

Neurgaonkar et al, "Epitaxial Growth of Ferroelectric Films for Optoelectronic (SAW) Applications", Journal of Crystal Growth, vol. 84 (1987) pp. 409–412.

Voronov et al, "Production of Single Crystal Films of Lithium Niobate by Liquid Phase Epitaxy", Deposited Doc. SPSTL 1 khp–D81, 148–55 1981 (abstract only).

*Primary Examiner*—Robert Kunemund
*Attorney, Agent, or Firm*—Sherman and Shalloway

[57] ABSTRACT

A lithium niobate single crystal thin film formed on a lithium tantalate substrate, in which the a-axis lattice constant of the lithium tantalate substrate and the a-axis lattice constant of the lithium niobate single crystal thin film are lattice matched.

To achieve the lattice matching, the lithium tantalate substrate is contacted with a molten composition to epitaxially grow a lithium niobate single crystal thin film, the molten composition mainly comprising Li$_2$O, V$_2$O$_5$, Nb$_2$O$_5$, Na$_2$O and MgO, whereby the a-axis lattice constant of the lithium niobate single crystal thin film and the a-axis lattice constant of the lithium tantalate substrate are matched to each other.

With this arrangement, a lithium niobate single crystal thin film with large thickness and low propagation loss can be obtained without poling, which could not be obtained with prior art methods, thus greatly contributing to the optical device industry.

19 Claims, 5 Drawing Sheets

LITHIUM NIOBATE SINGLE CRYSTAL THIN FILM AND PRODUCTION METHOD THEREOF

TECHNICAL FIELD

This invention relates to a lithium niobate single crystal thin film having a film thickness suited for use in various optical materials including thin film guided wave SHG devices, and to production method thereof.

BACKGROUND TECHNOLOGY

With recent advance in optical applications technology, shorter wavelengths of laser sources are increasing in demand.

This is because a shorter wavelength laser can improve the recording density and photosensitivity, and such a shorter wavelength laser is expected to be applied to optical devices such as optical discs, laser printers, and the like.

Therefore, there have been intensively conducted studies on second harmonic wave generating (SHG) devices which are capable of converting wavelengths of incident laser light to $\frac{1}{2}$.

Heretofore, bulk single crystals of nonlinear optical crystals have been used as such second harmonic wave generating (SHG) devices, using high-output gas lasers as light sources. However, since there has been a strong demand for compact optical disc devices, laser printers, and the like, and gas lasers, which use optical modulation, require external modulators, semiconductor have been increasingly and predominantly used in place of gas lasers, for their capability of direct modulation and low costs. For this purpose, thin film waveguide SHG device has become in demand in order to obtain high conversion outputs with low light source outputs of several mW to several tens of mW.

Heretofore, as nonlinear optical materials for use in such thin film waveguide SHG devices, there have been known a lithium niobate bulk single crystal which is diffused with Ti or the like to form a waveguide layer having a different refractive index, and a lithium tantalate substrate on which a lithium niobate single crystal thin film is formed as a waveguide by radio-frequency sputtering or the like, these methods have been difficult to obtain lithium niobate single crystal thin films of good crystallinity, and it has thus been impossible to obtain high conversion efficiency.

Liquid phase epitaxy method is considered to be advantageous as a method to fabricate single crystal thin films with good crystallinity.

Liquid phase epitaxial methods to obtain lithium niobate single crystal thin films are described, for example, in 1) Japanese Patent Publication 51-9720/1976, and Applied Physics Letters, Vol. 26, No. 1, January 1975 p8–10, in which a lithium niobate thin film for optical waveguide is formed on a lithium tantalate substrate by a liquid phase epitaxial method, using $Li_2O$ or $V_2O_5$ as a flux.

2) Japanese Patent Publication 56-47160/1981, in which a lithium niobate/lithium tantalate solid solution thin film containing Mg is formed by an epitaxial technique on a substrate using $Li_2O$ or $V_2O_5$ as a flux.

However, with liquid phase epitaxial methods which have heretofore been known, it is impossible to obtain a lithium niobate single crystal thin film with good crystallinity on a lithium tantalate substrate, and, it is particularly difficult to obtain a lithium niobate single crystal thin film having a thickness required for fabrication of SHG devices and having low propagation losses. There have been known no thin film waveguide SHG devices which have been practically applied.

The film thickness required to fabricate the thin film guided wave SHG devices means a thickness which is capable of coinciding the effective index of a basic wavelength light of wavelength $\lambda$ with that of the second harmonic wave of wavelength $\lambda/2$, to enable phase matching of incident laser light to the second harmonic wave, and, in particular, when a SHG device for semiconductor laser is fabricated using a lithium niobate thin film formed on a lithium tantalate substrate, it is considered that a lithium niobate single crystal thin film with a thickness of over 5 $\mu m$ is required to coincide the effective indices.

Furthermore, in order to obtain high-output thin film guided wave SHG devices, it is necessary to increase the difference between the substrate and the thin film waveguide layer, and studies for reduced refractive indices of substrate are being conducted, for example, 3) Japanese Patent Publication 63-27681/1988 discloses a technology in which vanadium pentoxide is diffused in a lithium tantalate substrate to form a low refractive index diffusion layer with a thickness of 3–6 $\mu m$, on top of which is epitaxially grown a lithium tantalate single crystal layer.

4) Japanese Patent Publication 60-34722/1985 discloses a technology in which magnesium oxide and vanadium pentoxide are simultaneously added to a lithium tantalate substrate, and a lithium tantalate single crystal layer is epitaxially grown.

However, these technologies use lithium tantalate as the thin film waveguide layer, and thus are not technologies for the formation of a lithium niobate single crystal thin film on a lithium tantalate substrate.

As described above, there have heretofore been no practical methods for the formation of a lithium niobate single crystal thin film on a lithium tantalate substrate, which is good in optical characteristics and has a sufficient thickness for the formation of waveguide optical devices such as SHG devices, optical deflectors, optical switches, and the like.

The inventors have conducted intensive studies to solve such problems. As a result, it has been found that these problems are caused by the fact that lattice constant of lithium niobate single crystal thin film differs from that of lithium tantalate substrate, resulting in a stress in the epitaxially grown crystal lattice, and found that a lithium niobate single crystal thin film which is lower in optical propagation loss than conventional thin films and has a sufficient thickness for the fabrication of optical devices can be practically produced by adjusting the lattice constant of lithium niobate single crystal thin film to match to the lattice constant of lithium tantalate substrate (lattice matching).

It has also been found that, as a means for lattice matching of lithium niobate single crystal to lithium tantalate substrate, sodium and magnesium can be contained in the lithium niobate single crystal to prevent optical damages (refractive index of crystal varied by irradiation with intense light) to lithium niobate single crystal and adjust the lattice constant of lithium niobate substrate.

Addition of sodium is described in 5) Journal of Crystal Growth 54 (1981) 572–576, in which sodium is added to lithium niobate to form a sodium-containing lithium niobate single crystal thin film with a thickness of 20 μm on a Y-cut lithium niobate substrate by a liquid phase epitaxial growth technique, and 6) Journal of Crystal Growth 84 (1987) 409–412, in which sodium is added to lithium niobate to form a sodium-containing lithium niobate single crystal thin film on a Y-cut lithium tantalate substrate by a liquid phase epitaxial growth technique.

However, these literatures describe variation of lattice constant of lithium niobate single crystal by containing sodium, but these technologies relate to SAW (surface acoustic wave) devices, and do not describe a film with good optical characteristics obtained by matching the optical characteristics and lattice matching to lithium tantalate substrate. Furthermore, lithium niobate single crystal thin films described in these literatures are all for SAW devices, the film described in the former literature uses a lithium niobate substrate, and the film described in the latter literature is formed on a lithium tantalate substrate but the film and the substrate are not lattice matched, neither cannot be used in the optical materials claimed by the present invention.

Furthermore, 7) U.S. Pat. No. 4,093,781 describes a method in which, when lithium ferrite film is formed on a substrate by a liquid phase epitaxial technique, lithium is substituted with sodium to match the lattice constant to that of the substrate, thereby forming a lithium ferrite film with no stress.

However, this invention is a technology on lithium ferrite, but cannot be used for optical materials which are disclosed in the present invention.

Also, 8) Japanese Patent Publication Laid-open S52-142477/1977 describes a technology which uses a very mild crystallization starting condition to moderately grow a crystal, thereby obtaining a liquid phase epitaxial crystal with no lattice stress.

However, this technology relates to fabrication of a semiconductor thin film, but does not relate to an optical thin film suited for use as an optical waveguide which is the purpose of the present invention.

As described above, the technologies of 4) to 8) do not relate to a lithium niobate single crystal thin film with good optical characteristics.

In the fabrication of a lithium niobate single crystal thin film, it is known that lithium tantalate substrates which are often used in the prior art are inferior in crystallinity to optical lithium tantalate, since they are for use in SAW devices.

For this reason, there has been a problem that a lithium niobate single crystal thin film formed on a lithium tantalate substrate for SAW device use in difficult to obtain improved crystallinity of the lithium niobate single crystal thin film, because the crystallinity of the substrate is transferred to the thin film.

Furthermore, a flat plate-formed single crystal substrate tends to be damaged by mechanical or thermal shocks, and has been especially difficult to handle in processes which involve heating such as liquid phase epitaxial growth and heat sputtering methods.

The inventors have conducted intensive studies on lithium niobate single crystal thin films, and found that the prior art problems can be solved by using a single crystal thin film formed on a lithium niobate single crystal plate as a substrate in place of the prior art flat plate-formed single crystal, thereby accomplishing the present invention.

DISCLOSURE OF THE INVENTION

In accordance with the present invention, there is provided a lithium niobate single crystal thin film formed on a lithium tantalate substrate, comprising the lithium niobate single crystal thin film lattice matched to the lithium tantalate substrate and having a propagation loss which is not more than 1.4 dB/cm, an intermediate layer comprising a single crystal thin film formed on a lithium niobate substrate, and a lithium niobate single crystal thin film formed on the intermediate layer.

There is also provided according to the present invention a production method for a lithium niobate single crystal thin film lattice matched to a lithium tantalate substrate, comprising bringing a lithium tantalate substrate in contact with a molten material to epitaxially grow a lithium niobate single crystal thin film, the molten material being a composition mainly comprising $Li_2O$, $V_2O_5$, $Nb_2O_5$, $Na_2O$, and $MgO$, thereby causing the lattice constant of the a-axis of the lithium niobate single crystal thin film to match to that of the a-axis of the lithium tantalate substrate.

The lithium niobate single crystal thin film according to the present invention must be formed on a lithium tantalate substrate and be lattice matched to the lithium tantalate substrate. This is because a lithium niobate single crystal thin film having very good optical characteristics can be formed in a large thickness, which cannot be obtained with prior art technologies, by the lattice matching of the lithium niobate single crystal thin film to the lithium tantalate substrate. The reason why the thus formed lithium niobate single crystal thin film has very good optical characteristics is that the lithium niobate single crystal thin film is integrated with the lithium tantalate substrate due to the lattice matching, and the lithium niobate single crystal thin film is of high quality with good crystallinity and very small in lattice strain and crystal defects, with no micro-cracks.

In the prior art, thin films have been inferior in crystallinity and micro-cracks observed in the films, since a thin film well lattice matched to the substrate could not be formed. Therefore, even scattering loss on the substrate interface and the thin film surface and absorption loss due to impurities were reduced to some extent by smoothening the substrate and thin film surfaces by polishing or chemical etching, or using a high-purity material with reduced impurities, the resulting thin films had a high propagation loss of 3–5 dB/cm, since absorption and scatting losses at the grain boundaries or scattering losses due to micro-cracks were very high, which could not be used for optical applications.

The substrate used in the present invention has a hexagonal crystal structure, and those which have an a-axis lattice constant within the range from 5.128 to 5.173 angstroms can be used. The shape is not limited to a flat plate, but substrates in the form of rods, fibers, and bulk may also be used.

The substrate includes, for example, those of $Al_2O_3$, ZnO, MgO, $Gd_3Ga_5O_{12}$, and lithium tantalate, and lithium tantalate is particularly preferable as the substrate.

This is because lithium tantalate substrate is suitable for epitaxial growth since its crystal system is similar to that of lithium niobate, and, the lithium tantalate substrate is commercially available and thus a high-quality product can be stably obtained.

Furthermore, as the lithium tantalate substrate for the present invention, those which contain various types of elements to vary the lattice constant or refractive index, or those which are surface treated by chemical etching or the like, can be used.

Surface roughness of the surface of the lithium tantalate for the formation of a lithium niobate single crystal thin film is preferably $R_{max} = 300$ to 1000 angstroms, measured according to JIS B0601. This is because it is difficult to reduce the $R_{max}$ value to below 300 angstroms, and, if the $R_{max}$ value is greater than 1000 angstroms, crystallinity of the lithium niobate single crystal thin film tends to become lowered.

The a-axis lattice constant of the lithium tantalate substrate is preferably 5.128 to 5.173 angstroms. This is because lattice matching to lithium niobate is not achieved out of this range.

The lithium niobate single crystal thin film according to the present invention is required to have an optical propagation loss which is not more than 1.4 dB/cm to semiconductor laser wave of 0.83 μm in wavelength, measure by a prism coupling method. This is because an optical propagation loss exceeding 1.4 dB/cm can not be used in various optical materials which are claimed by the present invention.

The propagation loss refers to the rate of reduction in light intensity per unit length in the transmission direction of the light, when the optical wave is transmitted through the thin film, which includes scattering loss and absorption loss. The scattering loss depends on the interface conditions between the substrate and the thin film, surface conditions of the thin film, and microcracks present in the thin film.

On the other hand, the absorption loss only relates to characteristics of the thin film, depending on the crystallinity and impurity contents of the thin film.

The lithium tantalate substrate according to the present invention preferably contains a different element at least in part of its surface.

This is because, by the addition of the different element, refractive index of the substrate can be varied, difference in refractive index between the substrate and the thin film waveguide layer can be increased, characteristics as an optical waveguide are improved, and, especially when used in SHG devices, SHG conversion efficiency is improved.

The different element refers to an element which differs from those constructing the substrate.

The different element is preferably a metal element.

The different element is preferably at least one which is selected from the group consisting of magnesium (Mg), titanium (Ti), vanadium (V), chromium (Cr), iron (Fe), nickel (Ni), and neodymium (Nd).

In the present invention, by adding the different element to a particular portion of the lithium tantalate substrate to form a pattern in the waveguide forming portion which is relatively lower in refractive index compared to unformed portions, only forming a slab-formed lithium niobate single crystal thin film on the substrate, the lithium niobate single crystal thin film formed in the pattern acts as a waveguide, thereby eliminating the need for the processing process for the formation of the waveguide.

The different element-containing layer in the lithium tantalate substrate is preferably 0.01 μm to 20 μm in thickness.

This is because the refractive index of the substrate can be varied without deteriorating the crystallinity of the substrate.

To adjust the refractive index of the waveguide forming portion of the substrate relatively lower than that of unformed portions, it is preferable to decrease the refractive index of the waveguide forming portion, or, increase the substrate refractive index of unformed portions.

Preferable different elements which increase the refractive index of the lithium tantalate substrate include Ti, Cr, Nd, Fe, and Ni, and those which decrease the refractive index include Mg and V.

Since these elements can vary only the refractive index of the surface with almost no effects on characteristic affecting the thin film formation, such as surface roughness, thin films having the same characteristics as conventional substrates can be formed under the same conditions.

The content of the different element in the surface portion is preferably within the following ranges.

Ti: 0.2 to 30 mole %
Cr: 0.02 to 20 mole %
Fe: 0.02 to 20 mole %
Ni: 0.02 to 20 mole %
Nd: 0.02 to 10 mole %
Mg: 0.1 to 20 mole %
V: 0.05 to 30 mole %

The above content is calculated by $$\text{Different element}/(\text{LiTaO}_3 + \text{different element}) \times 100$$

The reason why the above compositional range is preferable is that, when the content exceeds the above ranges, crystallinity of the substrate tends to be deteriorated, and, when the content is smaller than the above ranges, refractive index is not substantially varied.

More preferably, the content of the different element is within the following ranges.

Ti: 1.0 to 15 mole %
Cr: 0.2 to 10 mole %
Fe: 0.2 to 10 mole %
Ni: 0.2 to 10 mole %
Nd: 0.5 to 5 mole %
Mg: 2.0 to 10 mole %
V: 1.0 to 15 mole %

The above content is calculated by $$\text{Different element}/(\text{LiTaO}_3 + \text{different element}) \times 100$$

The different element can be contained in various forms such as atoms, ions, oxides and the like in the lithium tantalate substrate.

In the present invention, means for lattice matching of the lithium niobate single crystal thin film to the lithium tantalate substrate is not limited, but, since the lattice constant of the a-axis of lithium niobate is normally 5.145 angstroms and the lattice constant of the a-axis of lithium tantalate is 5.154 angstroms, it is advantageous to increase the lattice constant by containing a different element in the lithium niobate single crystal thin film or by altering the ratio (molar) of Li/Nb in the lithium niobate single crystal, or, decrease the lattice constant by containing a different element in the lithium tantalate substrate.

In the present invention, the different element for lattice matching of the lithium niobate single crystal thin film to the lithium tantalate substrate is preferably sodium and magnesium.

The reason why sodium and magnesium are preferable to be contained in the lithium niobate single crystal thin film is that since sodium and magnesium ions or atoms have an effect to increase the lattice constant (a-axis) of lithium niobate by substitution or doping to the crystal lattice of lithium niobate, lattice matching of the lithium niobate single crystal thin film and the lithium tantalate substrate can be easily achieved by adjusting the composition of sodium and magnesium, with no damages to the optical characteristics, and the magnesium has an important effect to prevent optical damages. To contain sodium and magnesium, it is desirable to contain sodium in an amount of 0.1 to 14.3 mole % and magnesium in an amount of 0.8 to 10.8 mole % to the lithium niobate single crystal. This is because when the sodium content is smaller than 0.1 mole %, the lattice constant is not increased to an extent that lattice matching is achieved to the lithium tantalate substrate, regardless of the content of magnesium. When the sodium content exceeds 14.3 mole %, the lattice constant becomes too large. So, lattice matching of the lithium niobate single crystal thin film and the lithium tantalate substrate is not achieved in both cases.

When the magnesium content is smaller than 0.8 mole %, it has an insufficient effect to prevent optical damages, and, when the magnesium content exceeds 10.8 mole %, it cannot be contained due to deposition of magnesium niobate crystals.

The sodium and magnesium contents are preferably 0.3 to 4.8 mole % and 3.5 to 8.6 mole %, respectively, more preferably, 0.8 to 3.2 mole % and 4.5 to 5.7 mole %, respectively.

Furthermore, in the present invention, the Li/Nb ratio of lithium niobate single crystal can be varied to increase the lattice constant of the a-axis.

The Li/Nb ratio (molar ratio) is preferably 41/59 to 56/44. This is because out of the range crystals such as $LiNb_3O_8$ and $Li_3NbO_4$ tend to deposit, and a lithium niobate single crystal with good optical characteristics cannot be obtained.

It is preferable that the different element contained in the lithium tantalate substrate is Ti.

The reason why Ti is advantageous to be contained as a different element in the lithium tantalate substrate is that Ti atoms or ions have an effect to decrease the a-axis lattice constant of the lithium tantalate substrate which can be lattice matched to the lithium niobate single crystal thin film.

The Ti content is preferably 0.2 to 30 mole %.

This is because when the content is out of the above range, lattice matching is difficult to the lithium niobate thin film.

When the lithium niobate single crystal thin film is lattice matched to a hexagonal single crystal substrate with an a-axis lattice constant of 5.128 to 5.150 angstroms, it is preferable to contain Ti in the lithium niobate single crystal thin film.

This is because Ti atoms or ions have an effect to decrease the a-axis lattice constant of the lithium niobate substrate, thereby achieving lattice matching to the substrate.

It is preferable that the lithium niobate single crystal thin film contains at least one selected from the group consisting of chromium (Cr), neodymium (Nd), rhodium (Rh), zinc (Zn), nickel (Ni), cobalt (Co), titanium (Ti), and vanadium (V).

The Rh content is preferably 0.05 to 20 mole %. This is because when the Rh content exceeds 20 mole %, optical characteristics of the lithium niobate single crystal thin film tend to deteriorate, and, when it is smaller than 0.05 mole %, the refractive index is nearly unchanged. It is particularly preferable that the Rh content is 0.1 to 10 mole %.

The Zn content is preferably 0.02 to 30 mole %. This is because when the Zn content exceeds 30 mole %, optical characteristics of the lithium niobate single crystal thin film tend to deteriorate, and, when it is smaller than 0.02 mole %, the refractive index is nearly unchanged. It is particularly preferable that the Zn content is 0.5 to 15 mole %.

The Ni content is preferably 0.10 to 20 mole %. This is because when the Ni content exceeds 20 mole %, optical characteristics of the lithium niobate single crystal thin film tend to deteriorate, and, when it is smaller than 0.10 mole %, the refractive index is nearly unchanged. It is particularly preferable that the Ni content is 1.0 to 10 mole %.

The Co content is preferably 0.05 to 20 mole %. This is because when the Co content exceeds 20 mole %, optical characteristics of the lithium niobate single crystal thin film tend to deteriorate, and, when it is smaller than 0.05 mole %, the refractive index is nearly unchanged. It is particularly preferable that the Co content is 0.1 to 10 mole %.

The Cr content is preferably 0.02 to 20 mole %. This is because when the Cr content exceeds 20 mole %, optical characteristics of the lithium niobate single crystal thin film tend to deteriorate, and, when it is smaller than 0.02 mole %, the refractive index is nearly unchanged. It is particularly preferable that the Cr content is 0.2 to 10 mole %.

The Ti content is preferably 0.2 to 30 mole %. This is because when the Ti content exceeds 30 mole %, optical characteristics of the lithium niobate single crystal thin film tend to deteriorate, and, when it is smaller than 0.2 mole %, the refractive index is nearly unchanged. It is particularly preferable that the Ti content is 1.0 to 15 mole %.

The Nd content is preferably 0.02 to 10 mole %. This is because when the Nd content exceeds 10 mole %, optical characteristics of the lithium niobate single crystal thin film tend to deteriorate, and, when it is smaller than 0.02 mole %, the refractive index is nearly unchanged. It is particularly preferable that the Nd content is 0.5 to 5 mole %.

The V content is preferably 0.05 to 30 mole %. This is because when the V content exceeds 30 mole %, crystals of different structure deposit in the lithium niobate single crystal thin film which tend to deteriorate its optical characteristics, and, when it is smaller than 0.05 mole %, the refractive index is nearly unchanged. It is particularly preferable that the V content is 1.0 to 15 mole %.

The above content is represented in mole % of a different element to lithium niobate single crystal.

When different elements such as Cr, Nd, Ti, V, Rh, Zn, Ni, and Co are contained in the lithium niobate single crystal thin film waveguide layer, it is preferable to control the contents of these different elements as needed because the lattice constant and refractive index of the lithium niobate single crystal thin film are varied simultaneously.

In the present invention, it is preferable to use the (0001) surface of the lithium tantalate substrate as the growth surface of the lithium niobate single crystal thin film.

The (0001) surface of the lithium tantalate substrate refers to a surface which is perpendicular to the c-axis of lithium tantalate.

The reason why the (0001) surface of the lithium tantalate substrate is preferable for use as the growth surface of the lithium niobate single crystal thin film is that since the lithium tantalate has a hexagonal crystal structure (FIG. 1) and the (0001) surface is composed of only the a-axis, it can be lattice matched to the lithium niobate single crystal thin film merely by changing the a-axis lattice constant.

Furthermore, the lattice constant (a-axis) of the lithium niobate single crystal thin film is preferably 99.81 to 100.07%, more preferably 99.92 to 100.03%, of the lattice constant of the lithium tantalate substrate.

For example, when the lattice constant of the lithium tantalate substrate is 5.153 angstroms, the lattice constant (a-axis) of the lithium niobate single crystal thin film is preferably 5.150 to 5.155 angstroms.

This is because when the lattice constant is out of the above range, it is difficult to achieve lattice matching of the lithium tantalate substrate and the lithium niobate single crystal thin film, and a sufficiently thick lithium niobate single crystal thin film with good optical characteristics usable as an optical material cannot be formed.

The lithium niobate single crystal thin film preferably has a thickness of over 5 μm, more preferably over 10 μm.

In the present invention, lattice constant is measured by ordinary X-ray powder diffraction.

Lattice constant is calculated by the least square method using $2\theta$ values of 15 peaks of lithium niobate detected at $Cu-2\theta=45$ to 90 degrees and its surface index. In the measurement, Si is used as an internal standard.

The production method according to the present invention will now be described.

The present invention is a method for producing a lithium niobate single crystal thin film in which a melt is contacted a lithium tantalate substrate to epitaxially grow a lithium niobate single crystal thin film. The melt is a composition which mainly comprises $Li_2O$, $V_2O_5$, $Nb_2O_5$, $Na_2O$, and $MgO$, thereby matching the a-axis lattice constant of the lithium niobate single crystal thin film to that of the lithium tantalate substrate.

This is because $Li_2O$ and $V_2O_5$ act as fluxes to achieve liquid phase epitaxial growth of a lithium niobate single crystal.

Sodium and magnesium can be contained in the lithium niobate single crystal thin film to increase the a-axis lattice constant of the lithium niobate single crystal thin film, and the a-axis lattice constant of the lithium niobate single crystal thin film can be matched to the a-axis lattice constant of the lithium tantalate substrate, thereby obtaining a thick film of lithium niobate single crystal thin film with low propagation losses.

The reason for sodium and magnesium to be simultaneous contained is that Mg alone cannot achieve lattice matching, and, Na alone is possible to achieve lattice matching, but cannot prevent optical damages.

Mg has an effect to prevent optical damages, and is thus suitable for use in optical materials.

Thus, sodium and magnesium are necessary to be contained in the lithium niobate single crystal thin film, and the melt composition necessarily contains $Na_2O$ and $MgO$ to achieve easy lattice matching.

Sodium and magnesium contained in the lithium niobate single crystal thin film to increase the a-axis lattice constant of the lithium niobate single crystal thin film. This is because the lithium niobate crystal lattice is doped with sodium and magnesium ions or atoms, or ions or atoms constituting the lithium niobate crystal lattice are substituted.

In the present invention, lattice matching is also achieved by adjusting the a-axis lattice constant of the lithium tantalate substrate by the addition of a different element to the a-axis lattice constant of the lithium niobate single crystal thin film.

In order to decrease the a-axis lattice constant of the lithium tantalate substrate, it is preferable to add Ti.

This is because Ti atoms or ions have an effect to decrease the a-axis lattice constant of the lithium tantalate substrate.

When Ti atoms or ions are preferably contained in amount of 0.2 to 30 mole % to the lithium tantalate single crystal.

This is because when the Ti content is smaller than 0.2 mole %, the lattice constant is not sufficiently reduced for lattice matching to the lithium niobate single crystal, and, when the Ti content exceeds 30 mole %, the lattice constant becomes too small, neither case cannot achieve lattice matching between the lithium tantalate substrate and the lithium niobate single crystal thin film.

The lithium tantalate substrate is preferably produced using a CZ (Czochralski) method.

Raw materials of the lithium tantalate substrate include lithium carbonate, tantalum pentoxide, titanium dioxide, and vanadium pentoxide.

It is advantageous that these raw materials are heated and melted in a platinum-rhodium crucible and a lithium tantalate single crystal is pulled up.

It is preferable to use an iridium crucible for the formation of optical materials since this type of crucible does not contaminate the crystal.

The a-axis lattice constant of the lithium tantalate substrate can be increased by adding a different element such as sodium.

This is because the amounts of different elements contained in the substrate and thin film can be reduced and the crystallinity can be improved by increasing the a-axis lattice constant of the lithium niobate single crystal thin film and decreasing the a-axis lattice constant of the lithium tantalate substrate.

In the present invention, a lithium niobate substrate on which a lithium tantalate single crystal thin film is formed can be used as a lithium tantalate substrate.

By forming a lithium tantalate single crystal thin film as an intermediate layer on the lithium niobate single crystal substrate, the crystallinity of the lithium niobate single crystal substrate can be transferred to the lithium tantalate single crystal thin film to give the lithium tantalate single crystal thin film the same crystallinity as the lithium niobate single crystal substrate.

The lithium niobate single crystal substrate is preferably of an optical grade.

The lithium niobate single crystal substrate with the lithium tantalate single crystal thin film formed on top can be produced by radio-frequency sputtering or liquid phase epitaxy, especially the liquid phase epitaxy is preferable.

This is because, with the liquid phase epitaxy, a lithium tantalate single crystal with good crystallinity can be obtained, and the liquid phase epitaxy is easier to transfer the crystallinity of the lithium niobate single crystal substrate.

In order to obtain a high-quality crystal, it is preferable to match the lattice constant of the lithium niobate single crystal substrate to the lattice constant of the lithium tantalate single crystal thin film, and methods to achieve this include 1) a different element such as Na or Mg is added to the lithium niobate substrate to increase the a-axis lattice constant, and a lithium tantalate single crystal thin film is formed by a conventional method know in the art to achieve lattice matching, or 2) when a lithium tantalate single crystal thin film is formed on the lithium niobate substrate, it is preferable to add Ti to the lithium tantalate single crystal to decrease the a-axis lattice constant, thereby achieving lattice matching.

The lithium tantalate substrate according to the present invention preferably contains a different element at least in part of its surface.

In addition to thermal diffusion, ion exchange, and ion implantation, the different element can be added by liquid phase epitaxy, or by previously adding the different element to the raw materials of lithium tantalate bulk single crystal.

After the substrate is heated for thermal diffusion of a different element, it is preferable, while it is in the heated state, to be brought in contact with a molten material for liquid epitaxial growth.

This is because, if the substrate is cooled after thermal diffusion and then heated again for liquid epitaxial growth, the crystallinity of the substrate tends to be deteriorated.

It is preferable to conduct the thermal diffusion in the same furnace during heating of the molten material simultaneously with preheating.

The thermal diffusion temperature is preferably 850° to 1000° C.

This is because diffusion does not take place at lower temperatures, and the crystallinity of the substrate deteriorates and external diffusion of Li takes place at temperatures above 1,000° C.

The thermal diffusion time is preferably 0.5 to 20 hours.

In the production method according to the present invention, it is preferable to preheat the lithium tantalate substrate before the substrate is contacted the molten material.

This is because the lithium tantalate substrate is very weak to thermal shocks.

The preheating time is preferably 20 to 60 minutes.

It is preferable to make the preheating at a position of 5 to 15 mm from the surface of the molten material.

When a thermal diffusion, ion exchange, or ion implantation method is used, a diffusion layer of the different element is formed. In this case, the diffusion layer is preferably 0.01 to 20 μm in thickness.

This is because when the diffusion layer thickness is smaller than 0.01 μm, the portion of guided wave diffused to portions of the substrate where the different element is not diffused increases, which does not satisfy the refractive index required for the substrate, and, when the diffusion layer thickness exceeds 20 μm, the crystallinity of the lithium niobate single crystal thin film is deteriorated, and characteristics sufficient for an optical waveguide cannot be obtained.

In the present invention, other than $Na_2O$ and MgO, it is advantageous that in triangular diagram of ternary system of $Li_2O$-$V_2O_5$-$Nb_2O_5$, the compositional range of $Li_2O$, $V_2O_5$, and $Nb_2O_5$ is within the area surrounded by five compositional points: A(88.90, 2.22, 8.88), B(55.00, 43.00, 2.00), C(46.50, 51.50, 2.00), D(11.11, 80.00, 8.89), and E(37.50, 5.00, 57.50).

The above compositional point refers to ($Li_2O$ mole %, $V_2O_5$ mole %, $Nb_2O_5$ mole %).

The reason why such a compositional range is advantageous is that lattice matching of the lithium niobate single crystal thin film and the lithium tantalate substrate is easy by using sodium and magnesium, the obtained lithium niobate single crystal thin film has good optical characteristics, especially low in propagation loss, and lithium niobate single crystal thin film of good quality can be obtained.

Furthermore, other than $Na_2O$ and MgO, it is preferable that in the three-component diagram of $Li_2O$-$V_2O_5$-$Nb_2O_5$, the compositional range of $Li_2O$, $V_2O_5$, and $Nb_2O_5$ is advantageously within the area surrounded by three compositional points: F(49.49, 45.46, 5.05), G(11.11, 80.00, 8.89), and H(42.81, 22.94, 34.25); more preferably within the compositional area surrounded by four compositional points: I(47.64, 46.12, 6.24), J(27.01, 64.69, 8.30), K(36.71, 37.97, 25.32), and L(44.05, 32.97, 22.98); and most preferably within the area surrounded by four compositional points: M(45.36, 46.45, 8.19), N(32.89, 57.05, 10.06), O(36.71, 44.30, 18.99), and P(44.95, 40.54, 14.51).

In the present invention, as the composition ratio of $Na_2O$, it is advantageous that $Na_2O/Li_2O$ molar ratio satisfies 2.0/98.0 to 93.5/6.5.

This is because when the $Na_2O$ molar ratio is out of the above range, lattice matching of the lithium tantalate substrate and the lithium niobate single crystal thin film is difficult.

As the content of $Na_2O$, the $Na_2O/Li_2O$ molar ratio is preferably 7.4/92.6 to 80.0/20.0, more preferably 16.7/83.3 to 48.4/51.6.

As the composition ratio of MgO, it is advantageous that MgO/lithium niobate molar ratio satisfies 0.1/99.9 to 25.0/75.0. The said lithium niobate refers to a theoretical amount of lithium niobate which can deposit from the molten state.

This is because when the composition ratio of MgO is lower than the above range, optical damage prevention effect of Mg is insufficient, and, when the composition ratio of MgO is higher than the above range, magnesium niobate crystals tend to deposit, and a lithium niobate single crystal thin film cannot be obtained.

Furthermore, as the content of MgO, the MgO/lithium niobate molar ratio is preferably in the range from 0.7/100 to 9.0/100, more preferably from 3.5/100 to 6.0/100.

In particular, in the range where composition ratios of $Li_2O$ and $Nb_2O_5$ satisfy $Li_2O/Nb_2O_5 > 1$, MgO/$Nb_2O_5$ molar ratio is advantageously in the range from 0.2/99.8 to 40.0/60.0.

As the composition ratio of MgO, the MgO/$Nb_2O_5$ molar ratio is preferably 0.7/50.0 to 9.0/50.0, more preferably 3.5/50.0 to 6.0/50.0.

For the raw material composition in the present invention, the composition ratio of oxides is selected so as to satisfy the above compositional range, and the raw materials are preferably in the form of oxides, or compounds which by heating are converted to oxides, such as $Na_2CO_3$, $Nb_2O_5$, $Li_2CO_3$, $V_2O_5$, MgO, $NaNbO_3$, $NaVO_3$, $LiNbO_3$, and $LiVO_3$. The said raw material is preferably heat melted at 600° to 1,300° C. It is preferable to conduct the heat melting in an air atmosphere or in an oxidizing atmosphere.

In the present invention, it is preferable that the molten material is supercooled and then contacted with the lithium tantalate substrate to achieve growth.

The cooling speed for supercooling of the molten material is preferably 0.5° to 300° C./hour.

Furthermore, after the liquid phase epitaxial growth, it is preferable to cool at a rate of 0.5° to 300° C./hour.

The cooling is preferably made exponentially from 400° C.

Furthermore, it is preferable to maintain the lithium tantalate substrate at its Curie temperature for a predetermined period of time, or cool at a rate of 0.1°–50° C./minute.

This is to prevent generation of cracks associated with phase transformation of the crystal at the Curie temperature.

The Curie temperature of the lithium tantalate substrate is normally 650° C. which is varied by the addition of a different element.

The growth temperature is desirably 600° to 1250° C. This is because lithium niobate has a melting point of 1250° C., above which no crystal deposits, and 600° C. is the melting point of the melt ($Li_2O$-$V_2O_5$), below which the raw materials cannot be melted.

Furthermore, the molten material is preferably stirred for 6 to 48 hours before liquid epitaxial growth.

This is because when the stirring time is shorter, unmolten crystal nucleus may exist in the molten material, and crystal growth takes place centering on these nucleus, leading to generation of irregularities on the surface of the lithium niobate single crystal thin film with deteriorated crystallinity.

In the present invention, it is preferable to use the (0001) surface of the lithium tantalate substrate as the growth surface of the lithium niobate single crystal thin film.

The (0001) surface of the lithium tantalate substrate refers to a surface which is perpendicular to the c-axis of lithium tantalate.

The reason why the (0001) surface of the lithium tantalate substrate is preferable for use as the growth surface of the lithium niobate single crystal thin film is that since the lithium tantalate has a hexagonal crystal structure (FIG. 1) and the (0001) surface is composed of only the a-axis, it can be lattice matched to the lithium niobate single crystal thin film merely by changing the a-axis lattice constant.

Furthermore, in the present invention, the a-axis lattice constant of the lithium niobate single crystal thin film is desirably 99.81 to 100.07% of the a-axis lattice constant of the lithium tantalate substrate. Out of the above range, a-axis lattice constants of the lithium tantalate substrate and the lithium niobate single crystal thin film largely differ, which causes generation of strain in the crystal lattice of the lithium niobate single crystal thin film, and a sufficiently thick lithium niobate single crystal thin film usable as optical materials cannot be formed.

It is preferable that the a-axis lattice constant of the lithium niobate single crystal thin film is 99.92 to 100.03% of the a-axis lattice constant of the lithium tantalate substrate. For example, when the a-axis lattice constant of the lithium tantalate substrate is 5.1538 angstroms, the a-axis lattice constant of the lithium niobate single crystal is preferably within the range of 5.150 to 5.155 angstroms.

During the growth, it is desirable to rotate the lithium tantalate substrate. This is because by rotating the lithium tantalate substrate, a crystal with uniform characteristics and thickness can be obtained.

Furthermore, it is desirable to make the rotation of the substrate in a horizontal position.

The rotation speed is advantageously 50 to 150 rpm.

Furthermore, it is desirable that at least one side of the lithium tantalate substrate is optically polished.

The lithium tantalate substrate is desirably chamfered at its edge. This is because if the edge is not chamfered, fine flaws tend to generate at the edge portion, which lead to cracking by thermal shock.

The chamfering may be on either R or C surface.

The lithium tantalate substrate preferably has a thickness of 0.5 to 2.0 mm.

This is because a substrate with a thickness of smaller than 0.5 mm tends to cause cracking, and a substrate thicker than 2.0 mm has a problems of pyroelectric effect (discharge by heating), and tends to be electrically charged by heating or polishing, attracting polishing debris which tends to cause scratches.

In the present invention the contact time of the lithium tantalate substrate and the molten material and the molten material temperature can be appropriately selected to control the thickness of the lithium niobate single crystal thin film deposited on the lithium niobate substrate deposited on the lithium tantalate substrate.

The growth speed of the lithium niobate single crystal thin film of the present invention is desirably 0.01 to 1.0 μm/minute.

This is because a growth speed faster than the above range causes waving in the lithium niobate single crystal thin film, and a growth rate slower than the above range requires too long time for growth of the thin film.

In the present invention, after the liquid phase epitaxial growth, it is desirable to remove flux from the surface of the lithium niobate single crystal thin film.

This is because residual flux results in uneven thickness of the film.

The flux removal is advantageously made by rotating the lithium niobate single crystal thin film formed on the lithium tantalate substrate at a speed of 100 to 10,000 rpm.

The rotation time is preferably 5 to 60 minutes.

In the present invention, other than $Li_2O$, $V_2O_5$, $Nb_2O_5$, $Na_2O$, and MgO, as ingredients of the molten material, oxides of elements selected from Nd, Rh, Zn, Ni, Co, Ti, Cr. and the like can be used.

By the addition of elements such as Nd. Rh, Zn, Ni, Co, Ti, and Cr, refractive index and lattice constant of the lithium niobate single crystal thin film can be varied.

Furthermore, as a method for matching the a-axis lattice constant of the lithium tantalate substrate to the a-axis lattice constant of lithium niobate, $K_2O$ and $V_2O_5$ are used as fluxes, and Li/Nb molar ratio in the deposited lithium niobate single crystal be varied to increase the a-axis lattice constant.

As a method for the purpose, it is preferable that the lithium tantalate substrate is contacted a molten material mainly comprising $K_2O$, $V_2O_5$, $Li_2O$, and $Nb_2O_5$ to achieve epitaxial growth.

The composition ratio of the $Li_2O$ and $Nb_2O_5$ is desirably within such range that the $Li_2O/Nb_2O_5$ molar ratio satisfies 43/57 to 56/44. Furthermore, the composition ratio of $K_2O$ and $V_2O_5$ is desirably within such range that the value of the flux ($KVO_3$) comprising $K_2O$ and $V_2O_5$/theoretical amount of depositable lithium niobate single crystal satisfies 25/75 to 75/25 in molar ratio.

The molten material desirably contains MgO or $Na_2O$.

The MgO can increase the a-axis lattice constant of the lithium niobate single crystal thin film and prevent optical damages.

The $Na_2O$ can increase the a-axis lattice constant of the lithium niobate single crystal thin film.

The MgO content is preferably within the range that the theoretical value of MgO/depositable amount of lithium niobate single crystal thin film satisfies 0.01/100 to 30/100.

This is because within the range the crystal structure of lithium niobate single crystal is not destructed and prevented from optical damages.

In the present invention, when the lithium niobate single crystal thin film a-axis is lattice matched to a hexagonal-structured single crystal substrate with an a-axis lattice constant of 5.128 to 5.150 angstroms, the lithium niobate single crystal thin film desirably contains Ti. This is because Ti atoms or ions have an effect to decrease lattice constant of lithium niobate substrate, thereby enabling lattice matching to the substrate.

In this case, it is desirable that the a-axis lattice constant of the lithium niobate single crystal thin film be lattice matched to the a-axis lattice constant of the substrate by using a composition mainly comprising $Li_2O$, $V_2O_5$, $Nb_2O_5$, and $TiO_2$.

It is preferable that in a three-component diagram of $Li_2O$-$V_2O_5$-$Nb_2O_5$, the compositional range of $Li_2O$, $V_2O_5$, and $Nb_2O_5$ is within the area surrounded by five compositional points: A(88.90, 2.22, 8.88), B(55.00, 43.00, 2.00), C(46.50, 51.50, 2.00), D(11.11, 80.00, 8.89), and E(37.50, 5.00, 57.50).

It is advantageous to add $TiO_2$ in an amount of 0.2 to 60 mole % of the theoretical amount of lithium niobate single crystal depositable from the molten composition.

In general, in order that lithium niobate and lithium tantalate single crystals have optically useful characteristics such as electrooptical and nonlinear optical effects, it is necessary to heat to above the Curie point and be applied with an electric field during the production process to polarize the crystals.

It is known that single crystals such as lithium niobate and lithium tantalate containing a different element cannot be easily polarized.

However, the lithium niobate single crystal thin film of the present invention is always in a polarized state even the lithium tantalate substrate is in a polarized state or electrically neutralized by polaritic inversion and thus has very superior characteristics such as electrooptical and nonlinear optical effects.

Therefore, the lithium niobate single crystal thin film and the lithium tantalate substrate of the present invention do not require a poling process, the production process is simple, and, since no poling process is required, and can use a lithium tantalate substrate containing a different element, which has been difficult to be used in the prior art.

The lithium niobate single crystal thin film thus formed on the lithium tantalate substrate has properties adequate as an optical waveguide, and, since thicker films can be obtained than the prior art, not only is ideally suitable as materials for thin film waveguide SHG devices, but also can be used in light-beam deflectors, optical modulators, and multi-mode optical devices.

Another lithium niobate single crystal thin film according to the present invention is necessarily formed on an intermediate layer comprising a single crystal thin film formed on the surface of a lithium niobate single crystal substrate.

This is because by forming a single crystal thin film as an intermediate layer on a lithium niobate single crystal substrate, the crystallinity of the lithium niobate single crystal substrate is transferred to the single crystal thin film as an intermediate layer to give the intermediate layer the same crystallinity as the lithium niobate single crystal substrate.

Furthermore, compared to the use of flat plate-formed single crystal substrates, lithium niobate single crystal thin film supports which are resistant to mechanical and thermal shocks with better crystallinity can be obtained than commercial single crystal substrates, and, single crystal materials, which are difficult to obtain flat plate-formed substrate, can be used, thereby relaxing limitation to the materials during optical device designing.

The reason why lithium niobate is desirable as a substrate material is that the substrate is commercially available, is resistant to mechanical and thermal shocks, and has almost no danger of breakage during the thin film formation process.

The lithium niobate single crystal substrate is desirably of an optical grade.

The optical grade lithium niobate single crystal refers to one which has a content of impurities such as iron of less than 2 ppm, a refractive index distribution of less than $10^{-4}$/cm (locally $\leq 10^{-5}$), and a raw material purity of over 99.999%.

The reason why the lithium niobate single crystal substrate is desirably of an optical grade is explained as follows.

Commercial single crystal substrates used as carriers for single crystal thin films have been for use in SAW devices, which have been high in impurity content ($>2$ ppm), large in refractive index distribution ($10^{-3}$/cm), and inferior in crystallinity. Therefore, when used as substrates for optical thin films, since thin film single crystal formed on the substrates transfers the crystallinity of the substrate, these substrates have tended to cause defects such as domains, which lead to deterioration in characteristics such as optical transmission, electrooptical effect and nonlinear optical effects.

Furthermore, optical-grade single crystal substrates are very little commercialized except for lithium niobate single crystal, are thus expensive and not suitable for general-purpose use.

Therefore, by forming a single crystal thin film on an optical-grade lithium niobate single crystal substrate, which is strong to mechanical and thermal shocks, the crystal characteristics of the optical-grade lithium niobate single crystal substrate can be transferred to the single crystal thin film.

Thus, by forming a lithium niobate single crystal thin film on a single crystal thin film intermediate layer having the same crystal characteristics as the optical grade, a lithium niobate single crystal thin film can be obtained which is far superior in crystallinity, optical transmission, electrooptical effect, and nonlinear optical effect.

The lithium niobate single crystal thin film according to the present invention is desirably lattice matched to the intermediate layer.

This is because when the lithium niobate single crystal thin film and the intermediate layer are lattice matched, a lithium niobate single crystal thin film which is very small in lattice strain and crystal defects, is superior in crystallinity, has no microcracks, and very good optical characteristics can be formed in a large film thickness, which cannot be obtained by prior art methods.

For the same reason, it is desirable that the lithium niobate single crystal substrate and the single crystal thin film intermediate layer are lattice matched.

The crystal structure of the single crystal thin film forming the intermediate layer desirably has a hexagonal structure, with an a-axis lattice constant within the range from 5.128 to 5.173 angstroms.

This is because out of this range, lattice matching is difficult to the lithium niobate single crystal substrate.

Furthermore, the intermediate layer desirably has a thickness of 0.2 to 30 μm.

This is because when the thickness of the intermediate layer is smaller than 0.2 μm, light tends to leak to the lithium niobate single crystal substrate side, and, when the thickness is greater than 30 μm, the crystallinity tends to deteriorate.

It is particularly preferable that the intermediate layer thickness is 0.5 to 10 μm, advantageously 1 to 5 μm.

Furthermore, the intermediate layer desirably contains a different element at least in part of its surface.

This is because by the addition of a different element, refractive index of the substrate can be varied, and the different in refractive index between the substrate and the thin film waveguide layer can be increased.

The different element refers to an element which differs from elements forming the substrate.

The different element is desirably a metal element.

The different element is desirably at least one selected from the group consisting of magnesium, titanium, vanadium, chromium, iron, nickel, and neodymium.

In the present invention, the different element can be added to the single crystal thin film to form a pattern with a relatively lower refractive index than non-formed portions. Thus, merely by forming a slab-formed lithium niobate single crystal thin film on the substrate, the lithium niobate single crystal thin film on the pattern portion forms a waveguide, thereby eliminating a waveguide formation process.

The different element-containing layer in the single crystal thin film desirably has a thickness of 0.01 to 20 μm.

As different elements having effects to increase refractive index of the single crystal thin film intermediate layer are advantageously used Ti, Cr, Nd. Fe, and Ni, and as those which decrease the refractive index are advantageously used Mg and V.

The different elements can be added to the lithium tantalate substrate in various formed such as atoms, ions, or oxides.

When a lithium tantalate single crystal is used as the single crystal thin film intermediate layer, the content of the different element in the surface portion is preferably within the following compositional range.

Ti: 0.2 to 30 mole %
Cr: 0.02 to 20 mole %
Fe: 0.02 to 20 mole %
Ni: 0.02 to 20 mole %
Nd: 0.02 to 10 mole %
Mg: 0.1 to 20 mole %
V: 0.05 to 30 mole %

The above content is calculated by $$\text{Different element}/(LiTaO_3+\text{different element})\times 100$$

The reason why the above compositional range is preferable is that, when the content exceeds the above ranges, crystallinity of the substrate tends to be deteriorated, and, when the content is smaller than the above ranges, refractive index is not substantially varied.

The lithium niobate single crystal thin film according to the present invention desirably has a propagation loss rate to semiconductor laser wave 0.83 μm in wavelength of less than 1.4 dB/cm, measured by a prism coupling method.

The propagation loss refers to a rate of reduction in light intensity per a unit length in the direction of light transmitting in the thin film, which includes scattering loss and absorption loss.

Furthermore, the lithium niobate single crystal thin film of the present invention desirably contains at least one selected from the group consisting of chromium (Cr), neodymium (Nd), rhodium (Rh), zinc (Zn), nickel (Ni), cobalt (Co), titanium (Ti), and vanadium (V).

The Rh content is desirably 0.05 to 20 mole %. This is because when the Rh content exceeds 20 mole %, optical characteristics of the lithium niobate single crystal thin film tend to deteriorate, and, when it is smaller than 0.05 mole %, the refractive index is almost unchanged. It is particularly preferable that the Rh content is 0.1 to 10 mole %.

The Zn content is desirably 0.02 to 30 mole %. This is because when the Zn content exceeds 30 mole %, optical characteristics of the lithium niobate single crystal thin film tend to deteriorate, and, when it is smaller than 0.02 mole %, the refractive index is almost unchanged. It is particularly preferable that the Zn content is 0.5 to 15 mole %.

The Ni content is desirably 0.10 to 20 mole %. This is because when the Ni content exceeds 20 mole %, optical characteristics of the lithium niobate single crystal thin film tend to deteriorate, and, when it is smaller than 0.10 mole %, the refractive index is almost unchanged. It is particularly preferable that the Ni content is 1.0 to 10 mole %.

The Co content is desirably 0.05 to 20 mole %. This is because when the Co content exceeds 20 mole %, optical characteristics of the lithium niobate single crystal thin film tend to deteriorate, and, when it is smaller than 0.05 mole %, the refractive index is almost unchanged. It is particularly preferable that the Co content is 0.1 to 10 mole %.

The Cr content is desirably 0.02 to 20 mole %. This is because when the Cr content exceeds 20 mole %, optical characteristics of the lithium niobate single crystal thin film tend to deteriorate, and, when it is smaller than 0.02 mole %, the refractive index is almost unchanged. It is particularly preferable that the Cr content is 0.2 to 10 mole %.

The Ti content is desirably 0.2 to 30 mole %. This is because when the Ti content exceeds 30 mole %, optical characteristics of the lithium niobate single crystal thin film tend to deteriorate, and, when it is smaller than 0.2 mole %, the refractive index is almost unchanged. It is particularly preferable that the Ti content is 1.0 to 15 mole %.

The Nd content is desirably 0.02 to 10 mole %. This is because when the Nd content exceeds 10 mole %, optical characteristics of the lithium niobate single crystal thin film tend to deteriorate, and, when it is smaller than 0.02 mole %, the refractive index is almost unchanged. It is particularly preferable that the Nd content is 0.5 to 5 mole %.

The V content is preferably 0.05 to 30 mole %. This is because when the V content exceeds 30 mole %, crystals of different structure deposit in the lithium niobate single crystal thin film which tend to deteriorate its optical characteristics, and, when it is smaller than 0.05 mole %, the refractive index is nearly unchanged. It is particularly preferable that the V content is 1.0 to 15 mole %.

The above content is represented in mole % of a different element to lithium niobate.

When different elements such as Cr, Nd, Ti, V, Rh, Zn, Ni, and Co are contained in the lithium niobate single crystal thin film, it is desirable to control the contents of these different elements as needed because the lattice constant and refractive index of the lithium niobate single crystal thin film are varied simultaneously.

The intermediate layer of the present invention is desirably a single crystal thin film of $Al_2O_3$, MgO, ZnO, $Gd_3Ga_5O_{12}$, or lithium tantalate, of which that of lithium tantalate single crystal is particularly preferable.

This is because lithium tantalate has a similar crystal structure to lithium niobate.

Furthermore, the lithium niobate single crystal thin film is desirably formed on the (0001) surface of the lithium tantalate single crystal thin film.

The said (0001) surface refers to a surface perpendicular to the c-axis of the crystal.

The lattice constant (a-axis) of the lithium niobate single crystal thin film formed on the lithium tantalate single crystal thin film is preferably 99.81 to 100.07%, more preferably 99.92 to 100.03%, of the lattice constant (a-axis) of the lithium tantalate single crystal thin film.

This is because out of the above range, it is difficult to achieve lattice matching of the lithium tantalate single crystal thin film and the lithium niobate single crystal thin film.

Furthermore, the lattice constant (a-axis) of the lithium niobate single crystal thin film is preferably 99.81 to 100.07%, more preferably 99.92 to 100.03%, of the lattice constant (a-axis) of the lithium tantalate single crystal thin film.

The lithium niobate single crystal thin film has a thickness of over 5 μm, more preferably over 10 μm.

In the present invention, it is desirable that sodium and magnesium are contained in the lithium niobate single crystal thin film or the lithium niobate single crystal substrate or both.

The is because since sodium and magnesium ions or atoms have an effect to increase the lattice constant (a-axis) of lithium niobate by substitution or doping to the crystal lattice of lithium niobate, lattice matching of the lithium tantalate single crystal thin film to the lithium niobate single crystal thin film or lithium niobate single crystal substrate, or both, can be achieved by adjusting the composition of sodium and magnesium.

The magnesium has an effect to prevent optical damages to the thin film.

When a lithium tantalate single crystal is selected as the single crystal thin film, the contents of sodium and magnesium are desirably 0.1 to 14.3 mole % and 0.8 to 10.8 mole %, respectively to the lithium niobate single crystal.

As the lithium niobate single crystal substrate, single crystal thin film, and lithium niobate single crystal thin film for the present invention, those which contain various types of elements to vary the lattice constant and refractive index, or those which are surface treated by optical polishing or chemical etching or the like, can be used.

The production method for the lithium niobate single crystal thin film of the present invention will now be briefly described.

Methods for the formation of a single crystal thin film on the lithium niobate single crystal substrate include radio-frequency sputtering and liquid phase epitaxial growth method and the like, especially the liquid phase epitaxial growth method is preferable.

This is because liquid phase epitaxial growth method is easier to transfer the crystallinity of the lithium niobate single crystal substrate.

Furthermore, it is desirable to match the lattice constant of the lithium niobate single crystal thin film and the lattice constant of the single crystal thin film intermediate layer in order to obtain a high-quality crystal. For the same reason, it is desirable to match the lithium niobate substrate and the lattice constant of the single crystal thin film intermediate layer.

When a single crystal thin film is formed on the lithium niobate single crystal substrate, various types of elements can be added to match the lattice constant, for example, when a lithium tantalate single crystal is used as the intermediate layer, solid solution of Ti and the like is desirable.

This is because Ti atoms or ions have an effect to decrease the a-axis lattice constant of lithium tantalate.

When a single crystal thin film is formed on the lithium niobate single crystal substrate, various types of elements can be added to match the lattice constant.

As methods for the formation of the lithium niobate single crystal thin film of the present invention on the intermediate layer are preferable radio-frequency sputtering and liquid phase epitaxial growth method, and the liquid phase epitaxial growth method is particularly preferable.

In the liquid phase epitaxial growth, it is desirable to contact the intermediate layer formation surface with a molten material comprising $Li_2O$, $Nb_2O_5$, $V_2O_5$, $Na_2O$, MgO and the like to achieve epitaxial growth.

Since $Na_2O$ and MgO have an effect to increase the a-axis lattice constant of the lithium niobate single crystal thin film, lattice matching to the single crystal intermediate layer is possible by controlling the composition.

Raw material ingredients of the molten material for liquid phase epitaxial growth are desirably oxides, or compounds which convert to oxides by heating, for example, a composition comprising $Na_2CO_3$, $Nb_2O_5$, $Li_2CO_3$, $V_2O_5$, and MgO.

It is desirable that the raw material ingredients are heated and melted in an air or oxygen atmosphere at 600 to 1,300° C.

Cooling rate to bring the molten material to a supercooled state is desirably 0.5° to 300° C./hour. The growth temperature is desirably 600° to 1,250° C. This is because the melting point of lithium niobate is 1,250°

C., above which no crystal deposits, and, 600° C. is the melting point of the flux, below which the raw materials cannot be melted.

During the growth, it is desirable to rotate the lithium niobate single crystal substrate. This is because rotation of the substrate results in a crystal with uniform characteristics and thickness.

Furthermore, the lithium niobate single crystal thin film growth surface of the intermediate layer is desirably optically polished, and then chemically etched.

In the present invention, in addition to $Nb_2O_5$, $V_2O_5$, $Li_2O$, $Na_2O$, and $MgO$, oxides of elements selected from the group consisting of Nd, Rh, Zn, Ni, Co, and Ti can be used in the molten material composition.

The thickness of the lithium niobate single crystal thin film according to the present invention deposited on the single crystal thin film can be controlled by adequately selecting the contact time of the substrate with the molten material and the molten material temperature.

Preferred embodiments of the formation method of a SHG device using the lithium niobate single crystal thin film of the present invention will now be described.

When the lithium niobate single crystal thin film is used as a SHG device, it is preferable that ordinary refractive index no and extraordinary refractive index $n_e$ of the lithium niobate single crystal thin film is in the ranges of $2.25 \leq$ no $\leq 2.40$ and $2.0 < n_e < n_o - 0.01$, respectively to a laser light source of 0.83 μm in wavelength (fundamental wavelength), ordinary refractive index $n_o$ to the generated second harmonic wave (0.415 μm) is greater than ordinary refractive index $n_o$ to the fundamental wavelength, and extraordinary refractive index $n_e$ is smaller than ordinary refractive index $n_o$ to the second harmonic wave.

When a SHG device is formed using the lithium niobate single crystal thin film of the present invention, it is preferable to form a wavelength-selective thin film (filter), which has a transmittance to the second harmonic wave of 100% or close to 100%, and completely or almost does not pass the fundamental laser wave, behind or directly on the outlet edge.

This is to remove unnecessary fundamental laser wave from the emitted light and efficiently take out only the necessary second harmonic wave.

Furthermore, by forming the wavelength-selective thin film directly on the outlet edge and adjusting so that it satisfies the reflection reducing condition to the second harmonic wave, reflection loss of second harmonic wave, which is caused due to a large difference in refractive index between the lithium niobate single crystal thin film layer and air, can be decreased to enhance SHG output.

The wavelength-selective thin film may be either formed at a position behind and away from the outlet edge or mounted onto the outlet edge using an adhesive.

When the thin film is mounted on the outlet edge using an adhesive, its thickness is desirably adjusted to meet the reflection reducing condition to the second harmonic wave, in order to enhance the SHG output.

Furthermore, when a SHG device is formed using the lithium niobate single crystal thin film of the present invention, it is desirable to integrate the SHG device and the semiconductor laser bare chip.

This is because the integration of the SHG device and the semiconductor laser bare chip is more advantageous in view of fabrication of a compact device, adaptability to mass production, cost, incident efficiency, and stability. Furthermore, it is desirable to house in an air-tight sealed package the semiconductor laser device formed by integration of the SHG device and the semiconductor laser bare chip in view of protection and long service life of the semiconductor laser bare chip.

The package is desirably filled with an inert gas.

The inert gas is preferably nitrogen.

The air-tight sealed package is required to be provided with a window to output the second harmonic wave.

The window to output the second harmonic wave refers to a hole with a sufficient size to output the second harmonic wave, provided with a light-transmissive plate to maintain the air-tightness.

The light-transmissive plate desirably has a wavelength selection property.

This is because by forming a second harmonic wave outputting window using a wavelength-selective light-transmissive plate, it can combine all purposes such as air-tight sealing of the chip, removal of the fundamental wave, improvement of transmittance of the second harmonic wave, and protection of the semiconductor laser bare chip and SHG device; and simplified production process, cost reduction, and improvement of transmittance to the second harmonic wave can be achieved, compared to a case in which the second harmonic wave outputting window is formed from ordinary glass, and a wavelength-selective film is provided inside or outside of the window glass.

As the wavelength-selective thin film or plate, a color filter, a glass substrate coated with a wavelength-selective interference film, a polarization plate, a polarization film or the like can be used.

The reason why the polarization plate or film can be used as a filter is that incident light is a TE mode and the second harmonic wave is TM mode, with an angle of 90° between both polarization planes.

As the material of the wavelength-selective thin film or the light-transmissive plate can be used an oxide such as $SiO_2$, $MgO$, $ZnO$, $Al_2O_3$ or the like, a composite oxide such as $LiNbO_3$, $LiTaO_3$, $Y_3Ga_5O_{12}$, $Gd_3Ga_5O_{12}$ or the like, or an organic material such as PMMA, MNA or the like.

The wavelength-selective thin film is preferably formed by sputtering, liquid phase epitaxial method, deposition, MBE (molecular beam epitaxial), MOCVD (metal organic chemical vapor deposition), ion plating, LB method, spin coating, dipping or the like.

$Li_2O/V_2O_3/Nb_2O_3$

A (88.90, 2.22, 8.88)
B (55.00, 43.00, 2.00)
C (46.50, 51.50, 2.00)
D (11.11, 80.00, 8.89)
E (37.50, 5.00, 57.50)
F (49.49, 45.46, 5.05)
G (11.11, 80.00, 8.89)
H (42.81, 22.94, 34.25)
I (47.64, 46.12, 6.24)
J (27.01, 64.69, 8.30)
K (36.71, 37.97, 25.32)

L (44.05, 32.97, 22.98)
M (45.36, 46.45, 8.19)
N (32.89, 57.05, 10.06)
O (36.71, 44.30, 18.99)
P (44.95, 40.54, 14.51)

Figure 1:
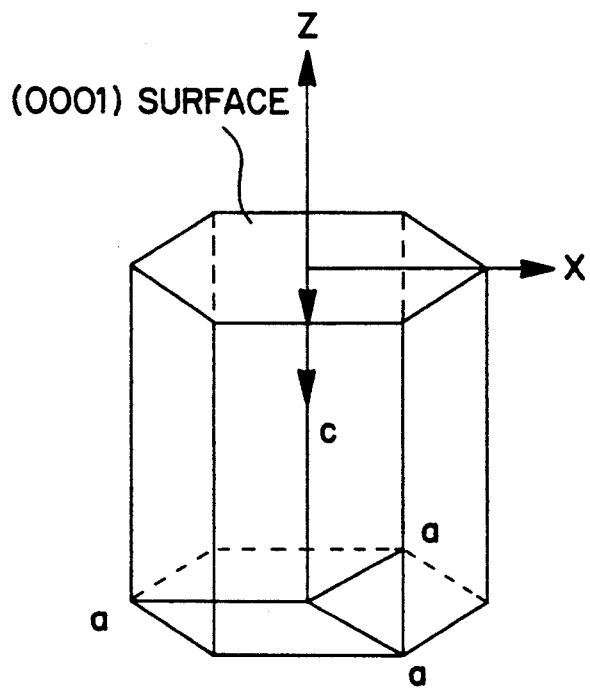
FIG. 1 is a schematic view showing the (0001) surface of a lithium tantalate single crystal substrate which is the growth surface of lithium niobate single crystal.
Figure 2:
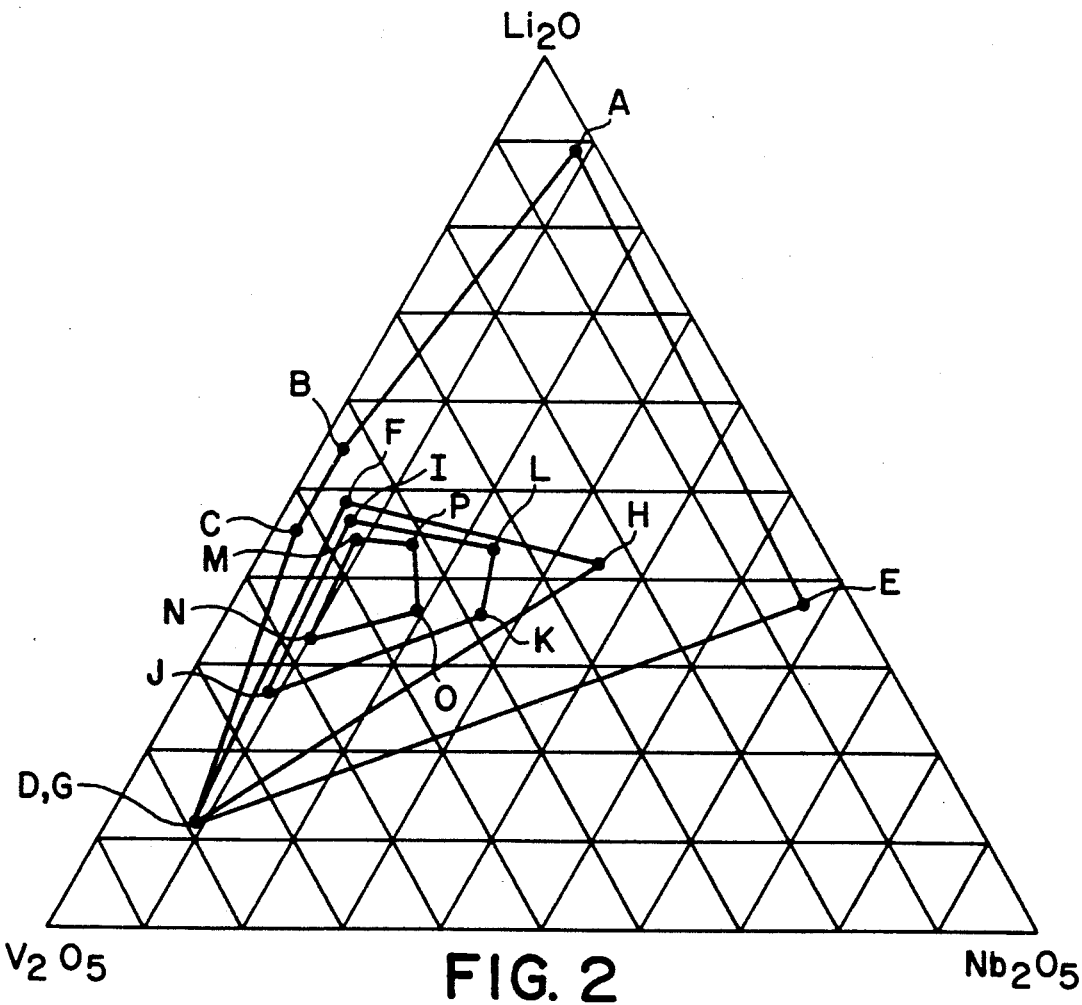
FIG. 2 is a triangular diagram of ternary system of $Li_2O$-$V_2O_3$-$Nb_2O_3$.
Figure 3:
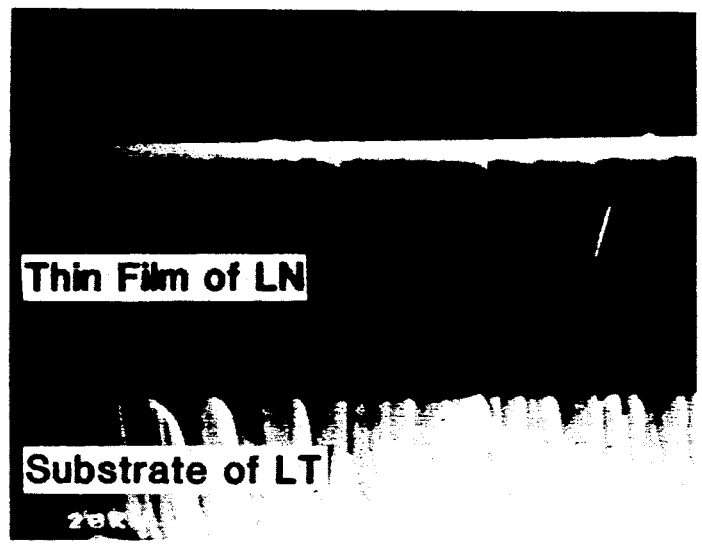

FIG. 3 is an electron microscopic photograph of a fracture surface of a lithium niobate single crystal thin film formed on a lithium tantalate single crystal substrate.

Although lattice matching cannot be confirmed with an electron microscope, the stripe pattern seen in the photograph is continuously observed both on the lithium tantalate single crystal substrate side and on the lithium niobate single crystal thin film side, and, since it is discontinuous on the lithium tantalate single crystal substrate side and the lithium niobate single crystal thin film side if not lattice matched, this photograph indirectly evidences good lattice matching of the lithium tantalate single crystal substrate and the lithium niobate single crystal thin film.

Figure 4:
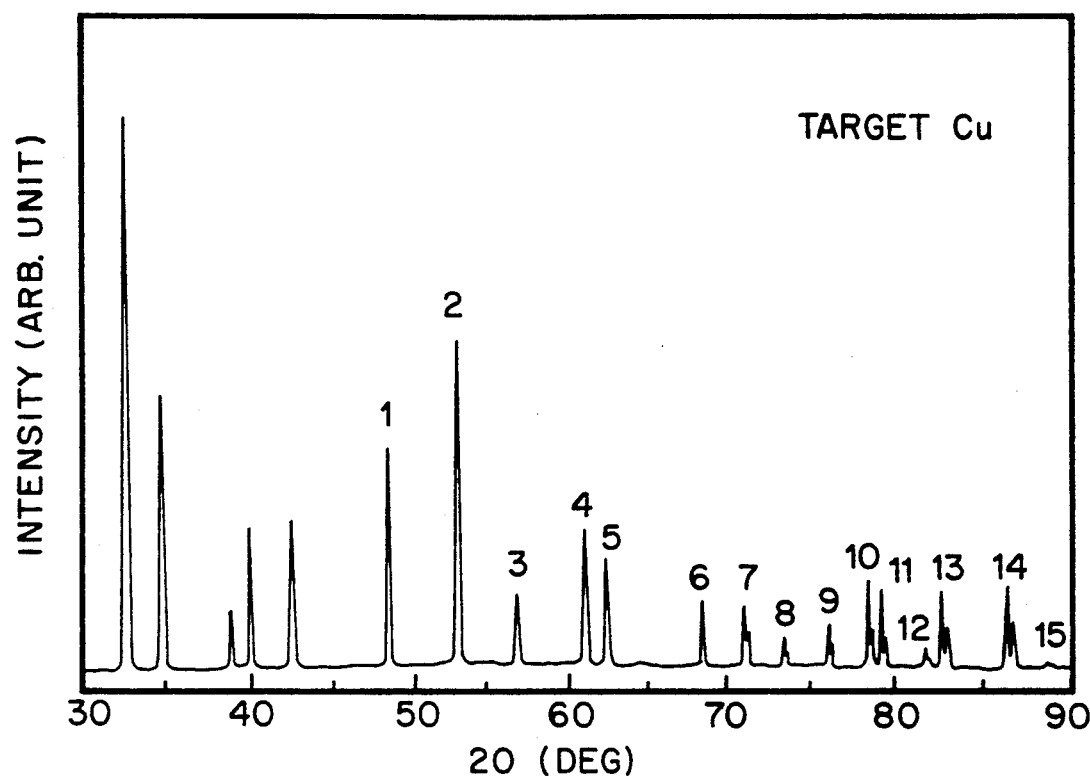

FIG. 4 is an X-ray diffraction pattern of the lithium niobate single crystal thin film according to the present invention.

Numbers (1) through (15) in the drawing are peaks specific to lithium niobate.

Figure 5:
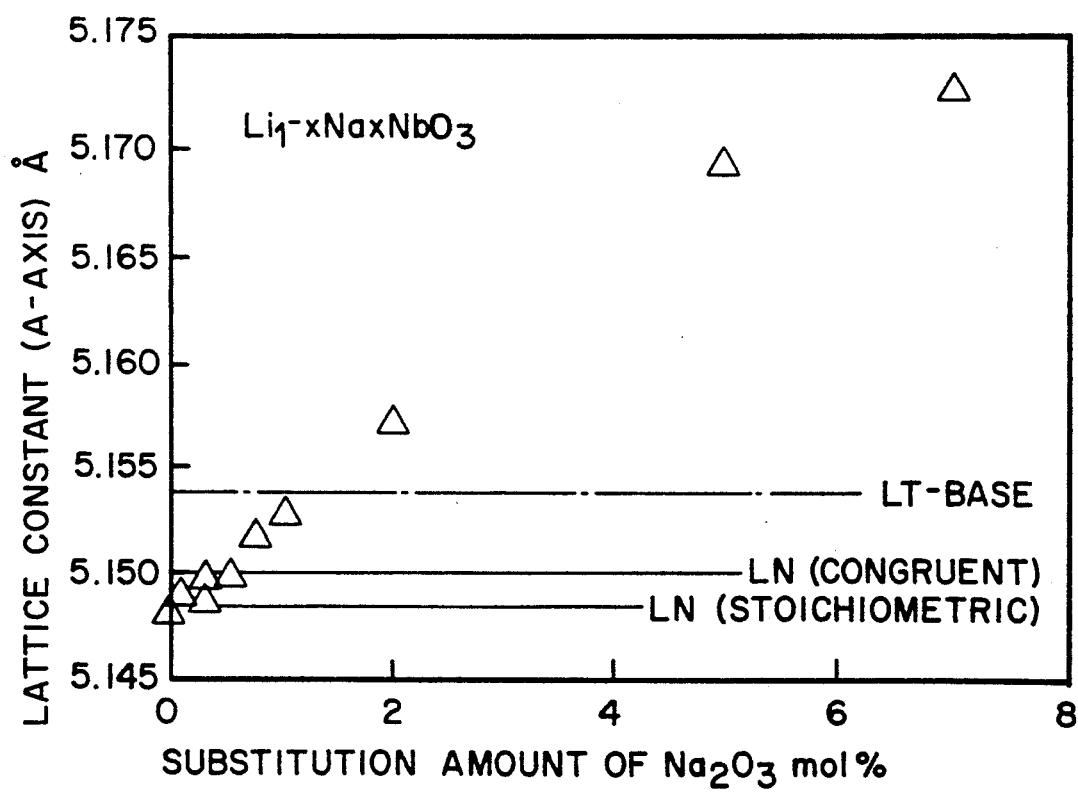

FIG. 5 shows relationship between substitution amount of $Na_2CO_3$ of the molten material and the a-axis lattice constant of the lithium niobate single crystal thin film.

Figure 6:
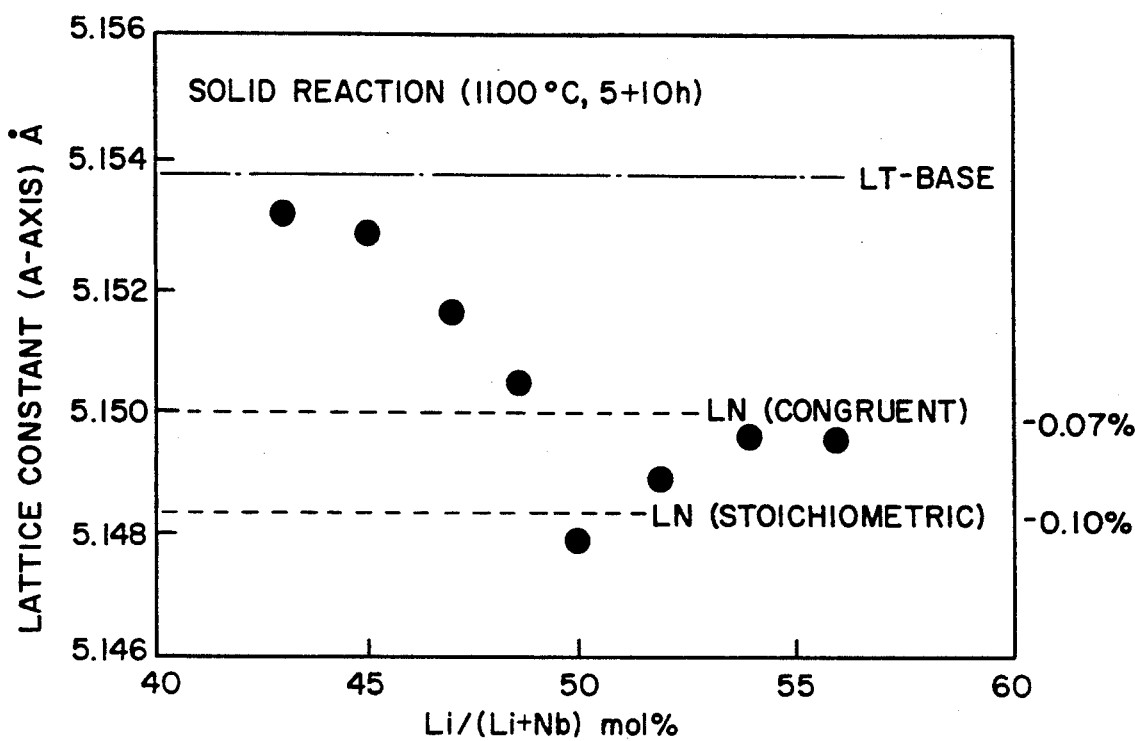

FIG. 6 shows relationship between Li/Nb molar ratio of the molten material and the a-axis lattice constant of the lithium niobate single crystal thin film.

Figure 7:
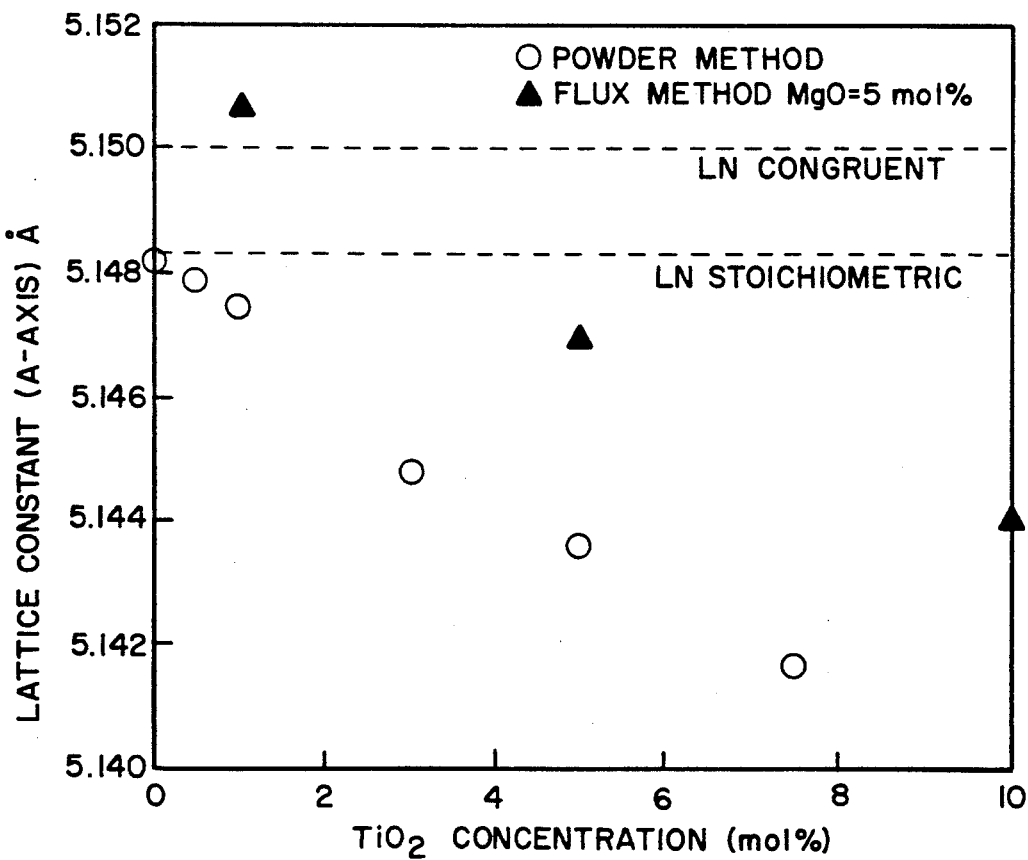

FIG. 7 shows $TiO_2$ concentration of the molten material and the a-axis lattice constant of the lithium niobate single crystal thin film.

Figure 8:
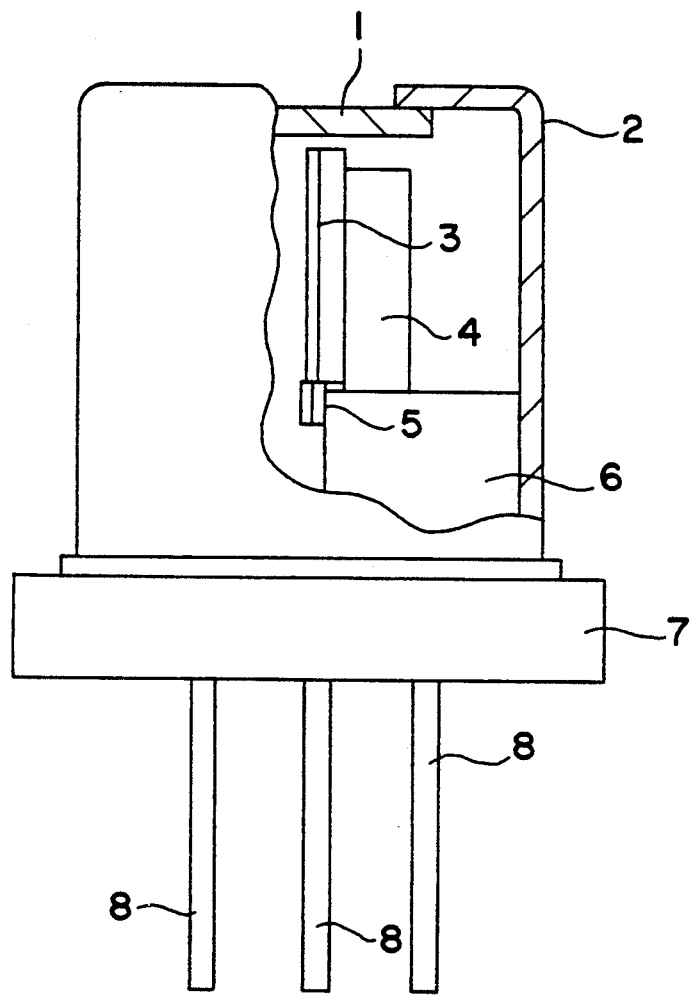

FIG. 8 is a schematic view showing an example of SHG device using the lithium niobate single crystal thin film according to the present invention.

In the drawings, numeral 1 denotes a wavelength-selective filter, numeral 2 denotes a sealing cap, numeral 3 denotes a SHG device, numeral 4 denotes a mounting base, numeral 5 denotes a semiconductor laser chip, numeral 6 denotes a heat sink, numeral 7 denotes a base, and numeral 8 denotes a lead pin.

DESCRIPTION OF THE PREFERRED EMBODIMENTS

Example 1

(1) A mixture of 20 mole % $Na_2CO_3$, 30 mole % $Li_2CO_3$, 40 mole % $V_2O_5$, 10 mole % $Nb_2O_5$, and 2 mole % MgO to a theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 912° C. at a cooling rate of 60° C. per hour, a lithium tantalate single crystal, of which the (0001) surface optically polished and then chemically etched, as a substrate material was immersed for 12 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 12 μm on the substrate material.

(4) The amounts of sodium and magnesium contained in the resulting lithium niobate single crystal thin film were 3 mole % and 2 mole %, respectively. The a-axis lattice constant of the thin film was 5.156 angstroms, and the refractive index measured at an incident wavelength of 1.15 μm was 2.235±0.001.

Example 2

(1) A mixture of 50 mole % $Li_2CO_3$, 40 mole % $V_2O_5$, 10 mole % $Nb_2O_5$, 45 mole $Na_2CO_3$ to a theoretical amount of $LiNbO_3$ depositable from the molten composition, and 7 mole % MgO to the theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 920° C. at a cooling rate of 60° C. per hour, a lithium tantalate single crystal, of which the (0001) surface optically polished, as a substrate material was immersed for 10 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 38 μm on the substrate material.

(4) The amounts of sodium and magnesium contained in the resulting lithium niobate single crystal thin film were 2 mole % and 6 mole %, respectively. The a-axis lattice constant was 5.155 angstroms, and the refractive index measured at an incident wavelength of 1.15 μm was 2.231±0.001.

Example 3

(1) A mixture of 12 mole % $Na_2CO_3$, 40 mole % $V_2O_5$, 10 mole % $Nb_2O_5$, 38 mole % $Li_2CO_3$, and 5 mole % MgO to a theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 938° C. at a cooling rate of 60° C. per hour, a lithium tantalate single crystal, of which the (0001) surface optically polished, as a substrate material was immersed for 20 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 23 μm on the substrate material.

(4) The amounts of sodium and magnesium contained in the resulting lithium niobate single crystal thin film were 1 mole % and 6 mole %, respectively. The a-axis lattice constant of the thin film was 5.153 angstroms, and the refractive index measured at an incident wavelength of 1.15 μm was 2.231±0.001.

Example 4

(1) A mixture of 12.8 mole % $Na_2CO_3$, 37.2 mole % $Li_2CO_3$, 40 mole % $V_2O_5$, 10 mole % $Nb_2O_5$, and 0.8 mole % $Nd_2O_3$ to a theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 925° C. at a cooling rate of 60° C. per hour, a lithium tantalate single crystal, of which the (0001) surface optically polished and then chemically etched, as a substrate material was immersed for 5 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/neodymium-containing lithium niobate single crystal thin film with a thickness of about 8 μm on the substrate material.

(4) The amounts of sodium and neodymium contained in the resulting lithium niobate single crystal thin film were 1.2 mole % and 0.4 mole %, respectively. The a-axis lattice constant of the thin film was 5.153 angstroms, and the refractive index measured at an incident wavelength of 1.15 μm was 2.232±0.001.

Example 5

(1) A mixture of 27.2 mole % $Na_2CO_3$, 22.8 mole % $Li_2CO_3$, 40 mole % $V_2O_5$, 10 mole % $Nb_2O_5$, and 12.0 mole % $TiO_2$ to a theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 896° C. at a cooling rate of 60° C. per hour, a lithium tantalate single crystal, of which the (0001) surface optically polished and then chemically etched, as a substrate material was immersed for 9 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/titanium-containing lithium niobate single crystal thin film with a thickness of about 6 μm on the substrate material.

(4) The amounts of sodium and titanium contained in the resulting lithium niobate single crystal thin film were 4.6 mole % and 5.0 mole %, respectively. The a-axis lattice constant of the thin film was 5.153 angstroms, and the refractive index measured at an incident wavelength of 1.15 μm was 2.241±0.001.

Example 6

(1) A mixture of 20 mole % $Na_2CO_3$, 30 mole % $Li_2CO_3$, 40 mole % $V_2O_5$, 10 mole % $Nb_2O_5$, and 2 mole % MgO ($MgO/Nb_2O_5=4/98$) to a theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 912° C. at a cooling rate of 60° C. per hour, a lithium tantalate single crystal, of which the (0001) surface optically polished, as a substrate material was immersed for 12 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 12 μm on the substrate material.

(4) The amounts of sodium and magnesium contained in the resulting lithium niobate single crystal thin film were 3 mole % and 2 mole %, respectively. The a-axis lattice constant of the thin film was 5.156 angstroms, and the refractive index measured at an incident wavelength of 1.15 μm was 2.235±0.001.

Example 7

(1) A mixture of 12 mole % $Na_2CO_3$, 38 mole % $Li_2CO_3$, 40 mole % $V_2O_5$, 10 mole % $Nb_2O_5$, and 5 mole % MgO ($MgO/Nb_2O_5=10/95$) to a theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 938° C. at a cooling rate of 60° C. per hour, a lithium tantalate single crystal, of which the (0001) surface optically polished, as a substrate material was immersed for 20 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 38 μm on the substrate material.

(4) The amounts of sodium and magnesium contained in the resulting lithium niobate single crystal thin film were 1 mole % and 6 mole %, respectively. The a-axis lattice constant of the thin film was 5.153 angstroms, and the refractive index measured at an incident wavelength of 1.15 μm was 2.231±0.001.

Example 8

(1) A mixture of 20.7 mole % $Na_2CO_3$, 29.3 mole % $Li_2CO_3$, 39.0 mole % $V_2O_5$, 11.0 mole % $Nb_2O_5$, 5 mole % MgO ($MgO/Nb_2O_5=10/95$) to a theoretical amount of $LiNbO_3$ depositable from the molten composition, and 12 mole % of $TiO_2$ to the theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 906° C. at a cooling rate of 60° C. per hour, a lithium tantalate single crystal, of which the (0001) surface optically polished and then chemically etched, as a substrate material was immersed for 8 minutes into the molten material while being rotated at 100 rpm.

(3) The substrate material was pulled up from the molten material, and, after the molten material was flung out at a rotation speed of 1,000 rpm for 30 seconds over the molten material, to obtain a sodium/magnesium/titanium-containing lithium niobate single crystal thin film with a thickness of about 7 μm on the substrate material.

(4) The amounts of sodium, magnesium, and titanium contained in the resulting lithium niobate single crystal thin film were 1.2 mole %, 6 mole %, and 5 mole %, respectively. The a-axis lattice constant of the thin film was 5.154 angstroms, and the refractive index measured at an incident wavelength of 1.15 μm was 2.240±0.001.

Example 9

(1) A mixture of 17.1 mole % $Na_2CO_3$, 32.9 mole % $Li_2CO_3$, 27.5 mole % $V_2O_5$, 22.5 mole % $Nb_2O_5$, and 3 mole % MgO ($MgO/Nb_2O_5=6/97$) to a theoretical amount of $LiNbO_3$ depositable from the molten composition was placed in a platinum crucible and heated to 1,150° C. to melt the composition in an air atmosphere in an epitaxial growth apparatus.

(2) After the molten material was gradually cooled to 983° C. at a cooling rate of 60° C. per hour, a lithium tantalate single crystal, of which the (0001) surface optically polished and then chemically etched, as a substrate material was immersed for 12 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 8 μm on the substrate material.

(4) The amounts of sodium and magnesium contained in the resulting lithium niobate single crystal thin film were 1 mole % and 4 mole %, respectively. The a-axis lattice constant of the thin film was 5.153 angstroms, and the refractive index measured at an incident wavelength of 1.15 μm was 2.231±0.001.

Example 10

(1) A mixture of 40.3 mole % $Li_2CO_3$, 38.8 mole % $V_2O_5$, 20.9 mole % $Nb_2O_5$, 53.1 mole % $Na_2CO_3$ to $Li_2CO_3$, 4 mole % MgO ($MgO/Nb_2O_5=8/96$) to a theoretical amount of $LiNbO_3$ depositable from the molten composition, and 2 mole % of $Cr_2O_3$ to the theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 968° C. at a cooling rate of 60° C. per hour, a lithium tantalate single crystal, of which the (0001) surface optically polished and then chemically etched, as a substrate material was immersed for 10 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a chromium/sodium/magnesium-containing lithium niobate single crystal thin film with a thickness of about 13 μm on the substrate material.

(4) The amounts of chromium, sodium, and magnesium, contained in the resulting lithium niobate single crystal thin film were 2 mole %, 1.5 mole %, and 5 mole %, respectively. The a-axis lattice constant of the thin film was 5.155 angstroms, and the refractive index measured at an incident wavelength of 1.15 μm was 2.236±0.001.

Example 11

(1) A mixture of 12.8 mole % $Na_2CO_3$, 37.2 mole % $Li_2CO_3$, 40.0 mole % $V_2O_5$, 10.0 mole % $Nb_2O_5$, and 5 mole % MgO ($MgO/Nb_2O_5=10/95$) to a theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 938° C. at a cooling rate of 60° C. per hour, a lithium tantalate single crystal, of which the (0001) surface optically polished and then chemically etched, as a substrate material was immersed for 15 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 9 μm on the substrate material.

(4) The amounts of sodium and magnesium contained in the resulting lithium niobate single crystal thin film were 1.2 mole % and 6 mole %, respectively. The a-axis lattice constant of the thin film was 5.154 angstroms, and the refractive index measured at an incident wavelength of 1.15 μm was 2.230±0.001.

Example 12

(1) A mixture of 33.1 mole % $Na_2CO_3$, 16.9 mole % $Li_2CO_3$, 43.0 mole % $V_2O_5$, 7.0 mole % $Nb_2O_5$, 3 mole % MgO ($MgO/Nb_2O_5=6/97$) to a theoretical amount of $LiNbO_3$ depositable from the molten composition, and 0.8 mole % of $Nd_2O_3$ to the theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 887° C. at a cooling rate of 60° C. per hour, a lithium tantalate single crystal, of which the (0001) surface optically polished and then chemically etched, as a substrate material was immersed for 8 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium/neodymium-containing lithium niobate single crystal thin film with a thickness of about 8 μm on the substrate material.

(4) The amounts of sodium, magnesium, and neodymium contained in the resulting lithium niobate single crystal thin film were 1 mole %, 4 mole %, and 0.4 mole %, respectively. The a-axis lattice constant of the thin film was 5.153 angstroms, and the refractive index measured at an incident wavelength of 1.15 μm was 2.232±0.001.

Example 13

(1) A mixture of 40.3 mole % $Li_2CO_3$, 38.8 mole % $V_2O_5$, 20.9 mole % $Nb_2O_5$, 83.3 mole % $Na_2CO_3$, to $Li_2CO_3$, 0.5 mole % MgO to a theoretical amount of $LiNbO_3$ depositable from the molten composition, and 2 mole % of $Cr_2O_3$ to the theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 968° C. at a cooling rate of 60° C. per hour, a lithium tantalate single crystal, of which the (0001) surface optically polished and then chemically etched, as a substrate material was immersed for 10 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium/chromium-containing lithium niobate single crystal thin film with a thickness of about 13 $\mu$m on the substrate material.

(4) The amounts of sodium, magnesium, and chromium contained in the resulting lithium niobate single crystal thin film were 1.5 mole %, 0.3 mole %, and 2 mole %, respectively. The a-axis lattice constant of the thin film was 5.155 angstroms, and the refractive index measured at an incident wavelength of 1.15 $\mu$m was 2.236±0.001.

Example 14

(1) A mixture of 40.3 mole % $Li_2CO_3$, 38.8 mole % $V_2O_5$, 20.9 mole % $Nb_2O_5$, 53.1 mole % $Na_2CO_3$ to $Li_2CO_3$, 4 mole % MgO to a theoretical amount of $LiNbO_3$ depositable from the molten composition, and 2 mole % of $Cr_2O_3$ to the theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 968° C. at a cooling rate of 60° C. per hour, a lithium tantalate single crystal, of which the (0001) surface optically polished and then chemically etched, as a substrate material was immersed for 10 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium/chromium-containing lithium niobate single crystal thin film with a thickness of about 13 $\mu$m on the substrate material.

(4) The amounts of sodium, magnesium, and chromium contained in the resulting lithium niobate single crystal thin film were 1.5 mole %, 5 mole %, and 2 mole %, respectively. The a-axis lattice constant of the thin film was 5.155 angstroms, and the refractive index measured at an incident wavelength of 1.15 $\mu$m was 2.236±0.001.

Example 15

(1) A mixture of 44.4 mole % $Na_2CO_3$, 44.4 mole % $Li_2CO_3$, 5.6 mole % $V_2O_5$, 5.6 mole % $Nb_2O_5$, and 5 mole % MgO ($MgO/LiNbO_3=5/95$) to a theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 840° C. at a cooling rate of 60° C. per hour, a lithium tantalate single crystal, of which the (0001) surface optically polished and then chemically etched, as a substrate material was immersed for 15 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 19 $\mu$m on the substrate material.

(4) The amounts of sodium and magnesium contained in the resulting lithium niobate single crystal thin film were 1 mole % and 6 mole %, respectively. The a-axis lattice constant of the thin film was 5.153 angstroms, and the refractive index measured at an incident wavelength of 1.15 $\mu$m was 2.230±0.001.

Example 16

(1) A mixture of 69 mole % $Li_2CO_3$, 16 mole % $V_2O_5$, 15 mole % $Nb_2O_5$, 60 mole % $Na_2CO_3$ ($Na_2O/Li_2O=45/69$) to the theoretical amount of $LiNbO_3$ depositable from the molten composition, 6 mole % MgO ($MgO/LiNbO_3=6/94$) to a theoretical amount of $LiNbO_3$ depositable from the molten composition, and 2 mole % of $Cr_2O_3$ to the theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 945° C. at a cooling rate of 60° C. per hour, a lithium tantalate single crystal, of which the (0001) surface optically polished and then chemically etched, as a substrate material was immersed for 10 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a chromium/sodium/magnesium-containing lithium niobate single crystal thin film with a thickness of about 11 $\mu$m on the substrate material.

(4) The amounts of chromium, sodium, and magnesium, contained in the resulting lithium niobate single crystal thin film were 2 mole %, 2 mole %, and 7 mole %, respectively. The a-axis lattice constant of the thin film was 5.155 angstroms, and the refractive index measured at an incident wavelength of 1.15 $\mu$m was 2.236±0.001.

Example 17

(1) A mixture of 44.4 mole % $Na_2CO_3$, 37.8 mole % $Li_2CO_3$, 15 mole % $V_2O_5$, 2.8 mole % $Nb_2O_5$, 3 mole % MgO ($MgO/LiNbO_3=3/97$) to a theoretical amount of $LiNbO_3$ depositable from the molten composition, and 15 mole % of $TiO_2$ to the theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 780° C. at a cooling rate of 60° C. per hour, a lithium tantalate single crystal, of which the (0001) surface optically polished and then chemically etched, as a substrate material was immersed for 8 minutes into the molten material while being rotated at 100 rpm.

(3) The substrate material was pulled up from the molten material, and, after the molten material was flung out at a rotation speed of 1,000 rpm for 30 seconds over the molten material, to obtain a sodium/magnesium/titanium-containing lithium niobate single crystal thin film with a thickness of about 7 $\mu$m on the substrate material.

(4) The amounts of sodium, magnesium, and titanium contained in the resulting lithium niobate single crystal thin film were 1.2 mole %, 4 mole %, and 8 mole %, respectively. The a-axis lattice constant of the thin film was 5.154 angstroms, and the refractive index measured at an incident wavelength of 1.15 μm was 2.239±0.001.

Example 18

(1) A mixture of 52 mole % $Li_2CO_3$, 44 mole % $V_2O_5$, 4 mole % $Nb_2O_5$, 48 mole % $Na_2CO_3$ ($Na_2O/Li_2O=7.4/52$) to the theoretical amount of $LiNbO_3$ depositable from the molten composition, and 5 mole % MgO ($MgO/LiNbO_3=5/95$) to a theoretical amount of $LiNbO_3$ depositable from the molten composition was placed in a platinum crucible and heated to 1,100° C. to melt the composition in an air atmosphere in an epitaxial growth apparatus.

(2) After the molten material was gradually cooled to 835° C. at a cooling rate of 60° C. per hour, a lithium tantalate single crystal, of which the (0001) surface optically polished and then chemically etched, as a substrate material was immersed for 12 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 8 μm on the substrate material.

(4) The amounts of sodium and magnesium contained in the resulting lithium niobate single crystal thin film were 1 mole % and 6 mole %, respectively. The a-axis lattice constant of the thin film was 5.153 angstroms, and the refractive index measured at an incident wavelength of 1.15 μm was 2.232±0.001.

Example 19

(1) A mixture of 50 mole % $Li_2CO_3$, 30 mole % $V_2O_5$, 20 mole % $Nb_2O_5$, 50 mole % $Na_2CO_3$ ($Na_2O/Li_2O=40/50$) to the theoretical amount of $LiNbO_3$ depositable from the molten composition, and 4 mole % MgO to a theoretical amount of $LiNbO_3$ depositable from the molten composition was placed in a platinum crucible and heated to 1,150° C. to melt the composition in an air atmosphere in an epitaxial growth apparatus.

(2) After the molten material was gradually cooled to 995° C. at a cooling rate of 60° C. per hour, a lithium tantalate single crystal, of which the (0001) surface optically polished and then chemically etched, as a substrate material was immersed for 12 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 9 μm on the substrate material.

(4) The amounts of sodium and magnesium contained in the resulting lithium niobate single crystal thin film were 2 mole % and 5 mole %, respectively. The a-axis lattice constant of the thin film was 5.155 angstroms, and the refractive index measured at an incident wavelength of 1.15 μm was 2.233±0.001.

Example 20

(1) A mixture of 47.4 mole % $Na_2CO_3$, 23.7 mole % $Li_2CO_3$, 4.2 mole % $V_2O_5$, 24.7 mole % $Nb_2O_5$, and 2 mole % MgO ($MgO/LiNbO_3=2/98$) to a theoretical amount of $LiNbO_3$ depositable from the molten composition was placed in a platinum crucible and heated to 1,150° C. to melt the composition in an air atmosphere in an epitaxial growth apparatus.

(2) After the molten material was gradually cooled to 1,023° C. at a cooling rate of 60° C. per hour, a lithium tantalate single crystal, of which the (0001) surface optically polished and then chemically etched, as a substrate material was immersed for 13 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 11 μm on the substrate material.

(4) The amounts of sodium and magnesium contained in the resulting lithium niobate single crystal thin film were 2.5 mole % and 3 mole %, respectively. The a-axis lattice constant of the thin film was 5.156 angstroms, and the refractive index measured at an incident wavelength of 1.15 μm was 2.235±0.001.

Example 21

(1) A mixture of 45.9 mole % $Na_2CO_3$, 36.8 mole % $Li_2CO_3$, 2.7 mole % $V_2O_5$, 14.6 mole % $Nb_2O_5$, 4 mole % MgO ($MgO/LiNbO_3=4/96$) to a theoretical amount of $LiNbO_3$ depositable from the molten composition, and 1 mole % of $Nd_2O_3$ to the theoretical amount of $LiNbO_3$ depositable from the molten composition was placed in a platinum crucible and heated to 1,150° C. to melt the composition in an air atmosphere in an epitaxial growth apparatus.

(2) After the molten material was gradually cooled to 970° C. at a cooling rate of 60° C. per hour, a lithium tantalate single crystal, of which the (0001) surface optically polished and then chemically etched, as a substrate material was immersed for 18 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium/neodymium-containing lithium niobate single crystal thin film with a thickness of about 9 μm on the substrate material.

(4) The amounts of sodium, magnesium, and neodymium contained in the resulting lithium niobate single crystal thin film were 1.2 mole %, 5 mole %, and 0.3 mole %, respectively. The a-axis lattice constant of the thin film was 5.154 angstroms, and the refractive index measured at an incident wavelength of 1.15 μm was 2.233±0.001.

Example 22

(1) A mixture of 60 mole % $Li_2CO_3$, 20 mole % $V_2O_5$, 20 mole % $Nb_2O_5$, 50 mole % $Na_2CO_3$ ($Na_2/Li_2O=40/60$) to the theoretical amount of $LiNbO_3$ depositable from the molten composition, and 4 mole % MgO ($MgO/LiNbO_3=4/96$) to the theoretical amount of $LiNbO_3$ depositable from the molten composition was placed in a platinum crucible and heated to 1,150° C. to melt the composition in an air atmosphere in an epitaxial growth apparatus.

(2) After the molten material was gradually cooled to 995° C. at a cooling rate of 60° C. per hour, a lithium tantalate single crystal, of which the (0001) surface optically polished and then chemically etched, as a substrate material was immersed for 12 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 8 μm on the substrate material.

(4) The amounts of sodium and magnesium contained in the resulting lithium niobate single crystal thin film were 1.8 mole % and 5 mole %, respectively. The a-axis lattice constant of the thin film was 5.155 angstroms, and the refractive index measured at an incident wavelength of 1.15 μm was 2.233±0.001.

Example 23

(1) A mixture of 52 mole % $Li_2CO_3$, 44 mole % $V_2O_5$, 4 mole % $Nb_2O_5$, 93 mole % $Na_2CO_3$ to the theoretical amount of $LiNbO_3$ depositable from the molten composition, and 0.01 mole % MgO to the theoretical amount of $LiNbO_3$ depositable from the molten composition was placed in a platinum crucible and heated to 1,150° C. to melt the composition in an air atmosphere in an epitaxial growth apparatus.

(2) After the molten material was gradually cooled to 835° C. at a cooling rate of 60° C. per hour, a lithium tantalate single crystal, of which the (0001) surface optically polished and then chemically etched, as a substrate material was immersed for 12 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 8 μm on the substrate material.

(4) The amounts of sodium and magnesium contained in the resulting lithium niobate single crystal thin film were 2 mole % and 0.02 mole %, respectively. The a-axis lattice constant of the thin film was 5.153 angstroms, and the refractive index measured at an incident wavelength of 1.15 μm was 2.232±0.001.

Example 24

(1) A mixture of 50 mole % $Li_2CO_3$, 30 mole % $V_2O_5$, 20 mole % $Nb_2O_5$, 86 mole % $Na_2CO_3$ to the amount of $LiNbO_3$, and 0.2 mole % MgO to the amount of $LiNbO_3$ was placed in a platinum crucible and heated to 1,150° C. to melt the composition in an air atmosphere in an epitaxial growth apparatus.

(2) After the molten material was gradually cooled to 995° C. at a cooling rate of 60° C. per hour, a lithium tantalate single crystal, of which the (0001) surface optically polished and then chemically etched, as a substrate material was immersed for 12 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 9 μm on the substrate material.

(4) The amounts of sodium and magnesium contained in the resulting lithium niobate single crystal thin film were 0.3 mole % and 5 mole %, respectively. The a-axis lattice constant of the thin film was 5.155 angstroms, and the refractive index measured at an incident wavelength of 1.15 μm was 2.233±0.001.

Example 25

(1) A mixture of 20 mole % $Na_2CO_3$, 30 mole % $Li_2CO_3$, 40 mole % $V_2O_5$, 10 mole % $Nb_2O_5$, and 2 mole % MgO to a theoretical amount of $LiNbO_3$ depositable from the molten composition was placed in a platinum crucible and heated to 1,100° C. to melt the composition in an air atmosphere in an epitaxial growth apparatus.

(2) The molten material was gradually cooled to 914° C. at a cooling rate of 60° C. per hour. A lithium tantalate single crystal, of which the (0001) surface optically polished, was formed on top with a V film 500 angstroms thick by RF sputtering, thermally diffused at 1,000° C., and then chemically etched was used as a substrate material. This substrate material was smaller by $1 \times 10^{-3}$ in ordinary refractive index than a substrate material which was not diffused with V. The substrate material was immersed for 13 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 11 μm on the substrate material.

(4) The amounts of sodium and magnesium contained in the resulting lithium niobate single crystal thin film were 3 mole % and 2 mole %, respectively. The a-axis lattice constant of the thin film was 5.156 angstroms, and the refractive index measured at an incident wavelength of 1.15 μm was 2.235±0.001.

Example 26

(1) A mixture of 50 mole % $Li_2CO_3$, 40 mole % $V_2O_5$, 10 mole % $Nb_2O_5$ 45 mole % of $Na_2CO_3$ to $LiNbO_3$, and 7 mole % MgO to a theoretical amount of $LiNbO_3$ depositable from the molten composition was placed in a platinum crucible and heated to 1,100° C. to melt the composition in an air atmosphere in an epitaxial growth apparatus.

(2) The molten material was gradually cooled to 918° C. at a cooling rate of 60° C. per hour. A lithium tantalate single crystal, of which the (0001) surface optically polished, was formed on top with a MgO film 1,000 angstroms in thickness and 5 μm in width by photolithography and RF sputtering, and thermally diffused at 1,000° C. to obtain a substrate material having a 5 μm wide MgO-diffused channel. This channel portion was smaller by $15 \times 10^{-3}$ in ordinary refractive index than the undiffused portion. The substrate material was immersed for 9 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 37 μm on the substrate material.

(4) The amounts of sodium and magnesium contained in the resulting lithium niobate single crystal thin film were 2 mole % and 6 mole %, respectively. The a-axis lattice constant of the thin film was 5.155 angstroms, and the refractive index measured at an incident wavelength of 1.15 μm was 2.231±0.001.

(5) The resulting lithium niobate single crystal thin film was end-surface polished, perpendicular to the 5 μm wide MgO-diffused channel, and applied with laser wave to the end surface to observe the near-field pattern of the output wave. As a result, it was confirmed that the laser wave was satisfactorily confined on the 5 μm wide MgO-diffused channel.

Example 27

(1) A mixture of 12 mole % $Na_2CO_3$, 40 mole % $V_2O_5$, 10 mole % $Nb_2O_5$, 38 mole % $Li_2CO_3$, and 5 mole % MgO to a theoretical amount of $LiNbO_3$ depositable from the molten composition was placed in a platinum crucible and heated to 1,100° C. to melt the composition in an air atmosphere in an epitaxial growth apparatus.

(2) The molten material was gradually cooled to 938° C. at a cooling rate of 60° C. per hour. A lithium tantalate single crystal, of which the (0001) surface optically polished, was formed on top with a Ti film 400 angstroms in thickness having a 5 μm wide window by photolithography and RF sputtering, and thermally diffused at 1,000° C. to obtain a substrate material having a 5 μm wide Ti-diffused channel. The Ti-diffused portion was greater by $2\times10^{-3}$ in ordinary refractive index than the channel portion. The substrate material was immersed for 15 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film with a thickness of about 17 μm on the substrate material.

(4) The amounts of sodium and magnesium contained in the resulting lithium niobate single crystal thin film were 1 mole % and 6 mole %, respectively. The a-axis lattice constant of the thin film was 5.153 angstroms, and the refractive index measured at an incident wavelength of 1.15 μm was 2.231±0.001.

(5) The resulting lithium niobate single crystal thin film was end-surface polished, perpendicular to the 5 μm wide Ti-undiffused channel, and applied with laser wave to the end surface to observe the near-field pattern of the output wave. As a result, it was confirmed that the laser wave was satisfactorily confined on the 5 μm wide Ti-undiffused channel.

Example 28

(1) A mixture of 12.8 mole % $Na_2CO_3$, 37.2 mole % $Li_2CO_3$, 40 mole % $V_2O_5$, 10 mole % $Nb_2O_5$, and 0.8 mole % of $Nd_2O_3$ to a theoretical amount of $LiNbO_3$ depositable from the molten composition was placed in a platinum crucible and heated to 1,100° C. to melt the composition in an air atmosphere in an epitaxial growth apparatus.

(2) The molten material was gradually cooled to 927° C. at a cooling rate of 60° C. per hour. A lithium tantalate single crystal, of which the (0001) surface optically polished, was formed on top with a Ni film 400 angstroms in thickness by RF sputtering, thermally diffused at 1,000° C., and chemically etched to obtain a substrate material. This substrate material was greater by $1\times10^{-3}$ in ordinary refractive index than a Ni-undiffused substrate material. The substrate material was immersed for 7 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/magnesium-containing lithium niobate single crystal thin film a thickness of about 11 μm on the substrate material.

(4) The amounts of sodium and neodymium contained in the resulting lithium niobate single crystal thin film were 1.2 mole % and 0.4 mole %, respectively. The a-axis lattice constant of the thin film was 5.153 angstroms, and the refractive index measured at an incident wavelength of 1.15 μm was 2.232±0.001.

Example 29

(1) A mixture of 27.2 mole % $Na_2CO_3$, 22.8 mole % $Li_2CO_3$, 40.0 mole % $V_2O_5$, 10 mole % $Nb_2O_5$, and 12.0 mole % of $TiO_2$ to a theoretical amount of $LiNbO_3$ depositable from the molten composition was placed in a platinum crucible and heated to 1,100° C. to melt the composition in an air atmosphere in an epitaxial growth apparatus.

(2) The molten material was gradually cooled to 896° C. at a cooling rate of 60° C. per hour. A lithium tantalate single crystal, of which the (0001) surface optically polished, was formed with a MgO film 400 angstroms in thickness and 5 μm in width and, on the portion other than the 5 μm wide MgO film, with a Cu film 400 angstroms in thickness, by photolithography and RF sputtering method, thermally diffused at 1,000° C. and chemically etched to obtain a substrate material having a 5 μm wide MgO-diffused channel. The MgO-diffused channel portion and the Cu-diffused portion other than the channel portion were smaller by $10\times10^{-3}$ and greater by $1\times10^{-3}$, respectively, in ordinary refractive index than the undiffused substrate material. The substrate material was immersed for 11 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a sodium/titanium-containing lithium niobate single crystal thin film with a thickness of about 7 μm on the substrate material.

(4) The amounts of sodium and titanium contained in the resulting lithium niobate single crystal thin film were 4.6 mole % and 5.0 mole %, respectively. The a-axis lattice constant of the thin film was 5.153 angstroms, and the refractive index measured at an incident wavelength of 1.15 μm was 2.241±0.001.

(5) The resulting lithium niobate single crystal thin film was end-surface polished, perpendicular to the 5 μm wide MgO-diffused channel, and applied with laser wave to the end surface to observe the near-field pattern of the output wave. As a result, it was confirmed that the laser wave was satisfactorily confined on the 5 μm wide MgO-diffused channel.

Example 30

(1) The surface of the $LiNbO_3$ single crystal thin film obtained in Example 25 was mirror-polished to form a slab-type waveguide, which uses the $LiNbO_3$ thin film as a waveguide.

(2) The film thickness of the slab-type waveguide was adjusted by ion beam etching to a phase-matching film thickness of 2.50 μm±0.05 μm.

(3) The slab-type waveguide obtained in (1) and (2) above was formed by photolithography into a ridge-type channel waveguide with a width of 10 μm, a film thickness of 2.50 μm±0.05 μm, and a step size of 1 μm.

(4) Both end surfaces of the channel-type waveguide obtained in (3) were mirror-polished by buffing to form a second harmonic wave generating (SHG) device which enables incidence and output of light through the end surfaces.

(5) The SHG device comprising a channel-type waveguide formed in (4) was precisely positioned so as its one end surface to oppose to a light-emitting area of a semiconductor laser, and the semiconductor laser chip and the SHG device were fixed on a silicon block with an ultraviolet-curing resin.

Furthermore, electrodes on the upper and lower surface of the semiconductor laser were bonded with wires to allow supply of a driving power.

(6) The thus integrated semiconductor laser and the SHG device were contained in a metallic air-tight package as shown in FIG. 8, the wires electrically connected with external pins to supply a driving power through the external pins, provided with a cap having a wavelength-selective glass window, and the inside air-tight sealed with a high-purity nitrogen gas atmosphere.

When the air-tight sealed package-type device formed using the SHG device comprising the LiNbO$_3$ thin film according to the present invention was applied with a driving voltage for an output of 48.0 mW of the semiconductor laser, the output of second harmonic wave outputted from the glass window was 2.0 mW, and the semiconductor laser output was 0.1 mW, thus efficiently outputting the second harmonic wave.

Example 31

(1) A LiTaO$_3$ single crystal thin film with a thickness of 5 μm was formed by RF sputtering on a 0.5-mm thick optical grade Z-cut LiNbO$_3$ single crystal substrate.

(2) A LiNbO$_3$ single crystal thin film of the present invention with a thickness of 7.5 μm was formed by liquid phase epitaxy on top of the LiTaO$_3$ single crystal thin film obtained in (1).

(3) The surface of the LiNbO$_3$ single crystal thin film obtained in (2) was mirror-polished to form a slab-type waveguide with the LiNbO$_3$ single crystal thin film as a waveguide.

(4) The thickness of the waveguide in (3) was adjusted by ion beam etching to a phase matching film thickness of 5.80±0.5 μm.

(5) The slab-type waveguide obtained in (3) and (4) was formed by photolithography into a ridge-type channel waveguide with a width of 10 μm, a film thickness of 5.80 μm±0.05 μm, and a step size of 1 μm.

(6) Both end surfaces of the channel-type waveguide obtained in (5) were mirror-polished by buffing to form a second harmonic wave generating (SHG) device which enables incidence and output of light through the end surfaces.

The thus obtained SHG device was measured for SHG output using a semiconductor laser of 0.83 μm in wavelength and an output of 40 mW as a light source. The result is shown in Table 2.

Example 32

(1) A LiTaO$_3$ single crystal thin film with a thickness of 8 μm was formed by RF sputtering on a 0.5 μm thick optical grade Z-cut LiNbO$_3$ single crystal substrate.

(2) A LiNbO$_3$ single crystal thin film of the present invention with a thickness of 5 μm was formed by liquid phase epitaxy on top of the LiTaO$_3$ single crystal thin film obtained in (1).

(3) The LiNbO$_3$ single crystal thin film obtained in (2) was formed using the same procedure of (3) to (5) in Example 31 into a ridge-type channel waveguide with a width of 10 μm, a film thickness of 2.70 μm±0.07 μm, and a step size of 1.2 μm.

(4) The LiNbO$_3$ single crystal thin film obtained in (3) was polished by the same method as in Example 31 to form a SHG device.

The thus obtained SHG device was measured for SHG output using a semiconductor laser of 0.83 μm in wavelength and an output of 40 mW as a light source. The result is shown in Table 2.

Example 33

(1) A LiTaO$_3$ single crystal thin film with a thickness of 6 μm was formed by RF sputtering on a 0.5 μm thick optical grade Z-cut LiNbO$_3$ single crystal substrate.

(2) A LiNbO$_3$ single crystal thin film of the present invention with a thickness of 5 μm was formed by liquid phase epitaxy on top of the LiTaO$_3$ single crystal thin film obtained in (1).

(3) The surface of the LiNbO$_3$ single crystal thin film obtained in (2) was mirror-polished to form a slab-type waveguide using the LiNbO$_3$ single crystal thin film.

(4) Both end surfaces of the LiNbO$_3$ single crystal thin film obtained in (3) were mirror-polished by buffing to allow incidence and output of light through the end surfaces, forming a SHG device.

The thus obtained SHG device was measured for SHG output using a semiconductor laser of 0.83 μm in wavelength and an output of 40 mW as a light source. The result is shown in Table 2.

Example 34

(1) The SHG device comprising a channel-type waveguide formed in Example 32 was precisely positioned so as its one end surface to oppose to a light-emitting area of a semiconductor laser, and the semiconductor laser chip and the SHG device were fixed on a silicon block with an ultraviolet-curable resin.

Furthermore, electrodes on the upper and lower surface of the semiconductor laser were bonded with wires to allow supply of a driving power.

(2) The thus integrated semiconductor laser and the SHG device were contained in a metallic air-tight package as shown in FIG. 5, the wires electrically connected with external pins to supply a driving power through the external pins, provided with a cap having a wavelength-selective glass window, and the inside air-tight sealed with a high-purity nitrogen gas atmosphere.

When the air-tight sealed package-type device formed using the SHG device comprising the LiNbO$_3$ thin film according to the present invention was applied with a driving voltage for an output of 48.0 mW of the semiconductor laser, the output of second harmonic wave outputted from the glass window was 3.5 mW, and the semiconductor laser output was 0.1 mW, thus efficiently outputting the second harmonic wave.

Example 35

(1) A mixture of 27.7 mole % $Li_2CO_3$, 29.3 mole % $Nb_2O_5$, 21.5 mole % $K_2CO_3$, 21.5 mole % $V_2O_5$ and 5 mole % MgO to a theoretical amount of $LiNbO_3$ was placed in a platinum crucible and heated to 1,100° C. to melt the composition in an air atmosphere in an epitaxial growth apparatus.

(2) The molten material was gradually cooled to 896° C. at a cooling rate of 60° C. per hour. A lithium tantalate single crystal, of which the (0001) surface optically polished, was formed with a MgO film 800 angstroms in thickness and 5 μm in width and, on the portion other than the 5 μm wide MgO film, with a Cu film 400 angstroms in thickness, by photolithography and RF sputtering, thermally diffused at 1,000° C. and chemically etched to obtain a substrate material having a 5 μm wide MgO-diffused channel. The MgO-diffused channel portion and the Cu-diffused portion other than the channel portion were smaller by $10 \times 10^{-3}$ and greater by $1 \times 10^{-3}$, respectively, in ordinary refractive index than the undiffused substrate material. The substrate material was immersed for 11 minutes into the molten material while being rotated at 100 rpm.

(3) The substrate material was pulled up from the molten material, and, after the molten material was flung out at a rotation speed of 1,000 rpm for 30 seconds over the molten material, gradually cooled to room temperature to obtain a MgO-containing lithium niobate single crystal thin film with a thickness of about 7 μm on the substrate material.

The lithium niobate single crystal thin films of the present invention obtained in Examples 1 to 29 and 35 were measured by prism coupling for optical propagation loss to semiconductor laser light of 0.83 μm in wavelength. The results are shown in Table 1.

These values are far superior characteristics which could not be obtained with the prior art.

FIG. 4 shows a powder X-ray diffraction pattern of the lithium niobate single crystal thin film according to the present invention, and Table 3 compares $2\theta$ values of 15 peaks specific to the lithium niobate with $2\theta$ values of conventional lithium niobate.

TABLE 1

| Example | Optical propagation loss (dB/cm) |
| --- | --- |
| 1 | 1.0 |
| 2 | 1.3 |
| 3 | 1.3 |
| 4 | 1.0 |
| 5 | 1.3 |
| 6 | 1.0 |
| 7 | 1.3 |
| 8 | 1.0 |
| 9 | 1.1 |
| 10 | 1.2 |
| 11 | 1.0 |
| 12 | 1.0 |
| 13 | 1.2 |
| 14 | 1.1 |
| 15 | 1.3 |
| 16 | 1.0 |
| 17 | 1.0 |
| 18 | 1.1 |
| 19 | 1.3 |
| 20 | 1.0 |
| 21 | 1.2 |
| 22 | 1.0 |
| 23 | 1.0 |
| 24 | 1.3 |
| 25 | 1.1 |
| 26 | 1.3 |
| 27 | 1.3 |
| 28 | 1.0 |
| 29 | 1.2 |
| 35 | 1.0 |

TABLE 2

| Example | SHG output (mW) |
| --- | --- |
| 31 | 0.6 |
| 32 | 3.9 |
| 33 | 0.3 |
| 34 | 3.5 |

TABLE 3

| No. | Surface index (h k l) | | | $2\theta$ value of $LiNbO_3$ (deg) | $2\theta$ value of $LiNbO_3$ (deg) |
| --- | --- | --- | --- | --- | --- |
| (1) | 0 | 2 | 4 | 48.515 | 48.467 |
| (2) | 1 | 1 | 6 | 53.243 | 53.213 |
| (3) | 0 | 1 | 8 | 56.993 | 56.933 |
| (4) | 2 | 1 | 4 | 61.091 | 61.043 |
| (5) | 3 | 0 | 0 | 62.435 | 62.351 |
| (6) | 2 | 0 | 8 | 68.549 | 68.495 |
| (7) | 1 | 0 | 10 | 71.207 | 71.147 |
| (8) | 2 | 2 | 0 | 73.523 | 73.427 |
| (9) | 3 | 0 | 6 | 76.091 | 75.983 |
| (10) | 3 | 1 | 2 | 78.509 | 78.419 |
| (11) | 1 | 2 | 8 | 79.247 | 79.151 |
| (12) | 0 | 2 | 10 | 81.779 | 81.683 |
| (13) | 1 | 3 | 4 | 82.811 | 82.727 |
| (14) | 2 | 2 | 6 | 86.489 | 86.381 |
| (15) | 0 | 4 | 2 | 88.847 | 88.739 | a-axis lattice constant of conventional $LiNbO_3$ = 5.1483 angstroms
a-axis lattice constant of the inventive $LiNbO_3$ = 5.1535 angstroms Furthermore, since a single crystal thin film is formed as an intermediate layer on the optical grade Z-cut $LiNbO_3$ single crystal substrate, the $LiNbO_3$ single crystal thin film of the present invention formed on top has a remarkably improved crystallinity, and the nonlinear optical coefficient that the $LiNbO_3$ single crystal has can be exhibited almost 100%, thereby obtaining about twice SHG output compared to a $LiNbO_3$ single crystal thin film formed on the $LiTaO_3$ single crystal substrate by liquid phase epitaxy of the same condition.

UTILIZABILITY IN INDUSTRY

With the present invention, a lithium niobate single crystal thin film, which has superior optical characteristics that cannot be obtained with prior art techniques and a sufficiently thick as required for optical devices, can be practically formed on a lithium tantalate substrate, the inventive single crystal thin film is ideally suited as a material for thin film waveguide type SHG devices, and as a material for optical modulators and multi-mode optical devices.

We claim:

1. A lithium niobate single crystal thin film formed on a lithium tantalate substrate, characterized in that said lithium niobate single crystal thin film is formed on a (0001) surface of said lithium tantalate substrate, the a-axis lattice constant of said lithium niobate single crystal thin film is 99.81 to 100.07% of the a-axis lattice constant of said lithium tantalate substrate, and said lithium niobate single crystal thin film has an optical propagation loss of 1.4 dB/cm or less.

2. The lithium niobate single crystal thin film of claim 1 wherein an a-axis lattice constant of said lithium tantalate substrate is 5.128 to 5.173 angstroms.

3. The lithium niobate single crystal thin film of claim 1 wherein said lithium tantalate substrates contains a different element at least in part of its surface.

4. The lithium niobate single crystal thin film of claim 3 wherein said different element is at least one selected from the group consisting of magnesium (Mg), titanium (Ti), vanadium (V), chromium (Cr), iron (Fe), nickel (Ni), and neodymium (Nd).

5. The lithium niobate single crystal thin film of claim 1 containing sodium.

6. The lithium niobate single crystal thin film of claim 5 wherein the content of sodium is 0.1 to 14.3 mole %.

7. The lithium niobate single crystal thin film of claim 1 containing magnesium.

8. The lithium niobate single crystal thin film of claim 7 wherein the content of magnesium is 0.8 to 10.8 mole %.

9. The lithium niobate single crystal thin film of claim 1 containing at least one element selected from the group consisting of neodymium (Nd), rhodium (Rh), zinc (Zn), nickel (Ni), cobalt (Co), and titanium (Ti).

10. A method for producing a lithium niobate single crystal thin film comprising contacting a lithium tantalate substrate with a molten composition to epitaxially grow a lithium niobate single crystal thin film, said molten composition comprising $Li_2O$, $V_2O_5$, $Nb_2O_5$, $Na_2O$ and $M_gO$, thereby growing said lithium niobate single crystal thin film having an a-axis lattice constant of 99.81 to 100.07% that of said lithium tantalate substrate on a (0001) surface of said lithium tantalate substrate.

11. The method for producing a lithium niobate single crystal thin film of claim 10 wherein the a-axis lattice constant of said lithium tantalate substrate is adjusted to 5.128 to 5.173 angstroms.

12. The method for producing a lithium niobate single crystal thin film of claim 10 wherein said lithium tantalate substrate is a lithium niobate single crystal substrate formed with a lithium tantalate single crystal thin film.

13. The method for producing a lithium niobate single crystal thin film of claim 10 wherein said lithium tantalate substrate is added a different element at least in part of its surface.

14. The method for producing a lithium niobate single crystal thin film of claim 10 wherein the method of adding said different element is selected from thermal diffusion, ion exchange, ion implantation, liquid phase epitaxy, and raw material addition.

15. The method for producing a lithium niobate single crystal thin film of claim 10 wherein said molten composition is in a compositional range of $Li_2O$, $V_2O_5$, and $Nb_2O_5$ within the area surrounded by five compositional points A(88.90, 2.22, 8.88), B(55.00, 43.00, 2.00), C(46.50, 51.50, 2.00), D(11.11, 80.00, 8.89), and E(37.50, 5.00, 57.50) in a triangular diagram of ternary system of $Li_2O$-$V_2O_5$-$Nb_2O_5$.

16. The method for producing a lithium niobate single crystal thin film of claim 10 wherein the $Na_2O/Li_2O$ molar ratio is 2.0/98.0 to 93.5/6.5.

17. The method for producing a lithium niobate single crystal thin film of claim 10 wherein the MgO/lithium niobate molar ratio is 0.1/99.9 to 25.0/75.0.

18. The method for producing a lithium niobate single crystal thin film of claim 10 wherein said molten composition contains at least one oxide selected from the group consisting of oxides of neodymium (Nd), rhodium (Rh), zinc (Zn), nickel (Ni), cobalt (Co), and titanium (Ti).

19. The method for producing a lithium niobate single crystal thin film of claim 10 wherein said lithium niobate single crystal thin film is grown at a temperature of 600° to 1,250° C.

* * * * *